United States Patent [19]

Kintner

[11] 4,038,562
[45] July 26, 1977

[54] LADDER STATIC LOGIC CONTROL SYSTEM AND METHOD OF MAKING

[75] Inventor: Paul M. Kintner, Bayside, Wis.

[73] Assignee: Cutler-Hammer, Inc., Milwaukee, Wis.

[21] Appl. No.: 263,712

[22] Filed: June 16, 1972

[51] Int. Cl.² .............................................. H03K 19/08
[52] U.S. Cl. .................................... 307/203; 307/213; 307/218; 307/293
[58] Field of Search ................ 307/203, 207, 293, 213, 307/303, 215, 218

[56] References Cited

U.S. PATENT DOCUMENTS

| | | | |
|---|---|---|---|
| 3,036,222 | 5/1962 | Witt | 307/203 X |
| 3,201,601 | 8/1965 | Chevalier et al. | 307/207 |
| 3,538,443 | 11/1970 | Tague | 307/203 X |

Primary Examiner—Stanley D. Miller, Jr.
Attorney, Agent, or Firm—Hugh R. Rather; William A. Autio; Michael E. Taken

[57] ABSTRACT

A ladder static logic control system having static logic circuits that are logic equivalents of the electromagnetic, mechanical and other circuit components in a prior electromechanical ladder diagram. Ladder static logic circuits that are logic equivalents of electromagnetic devices such as control coils, latching coils and timer coils and having a built-in operating time delay to eliminate any logic race problems. A method of making the above ladder static logic control system by starting with a ladder diagram of a prior art electro-mechanical control system and substituting a ladder static logic circuit for each of the electro-mechanical component counterparts appearing therein.

34 Claims, 37 Drawing Figures

LSL SWITCH CONTACTS

LSL OUTPUT DRIVER

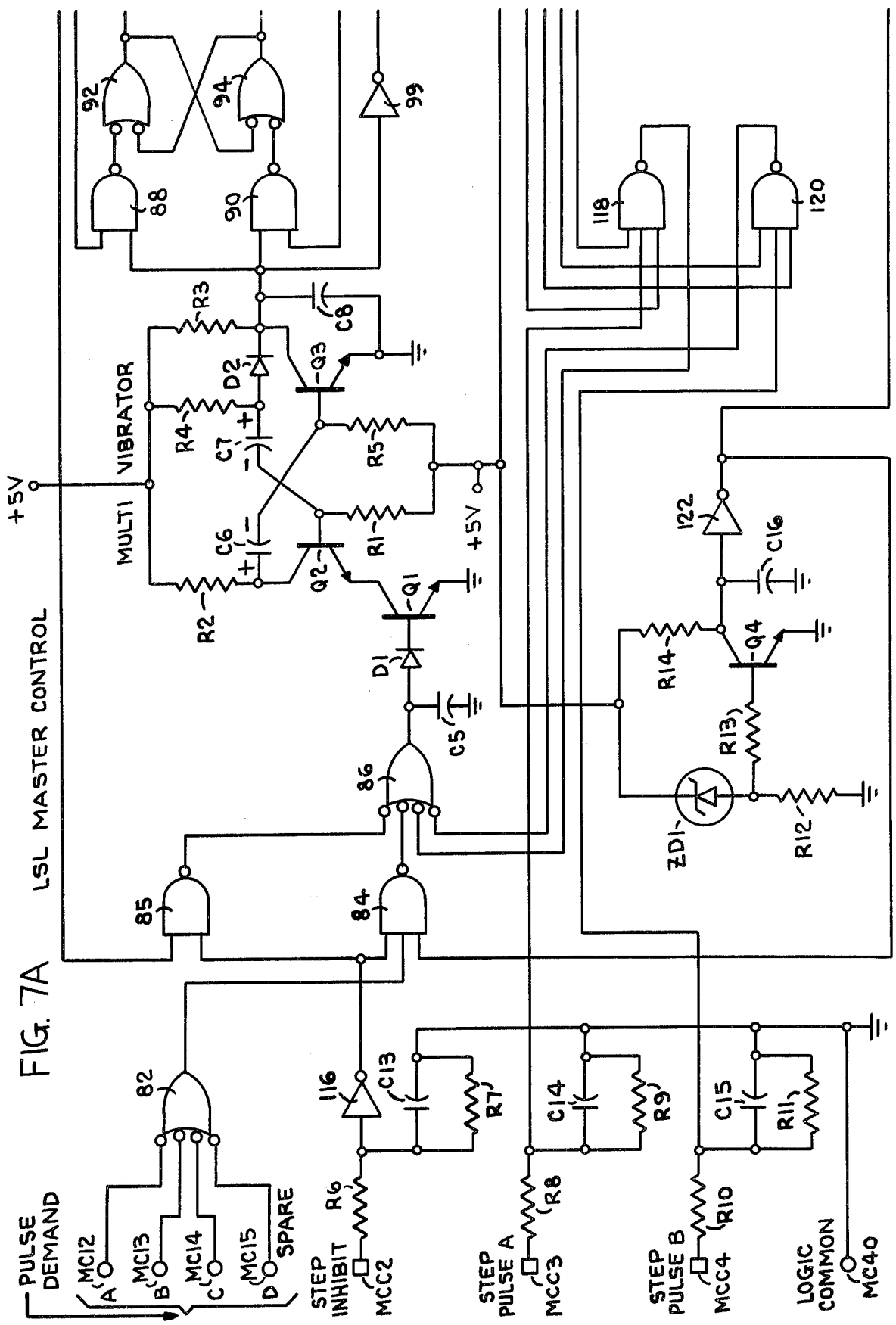
FIG. 7A  LSL MASTER CONTROL

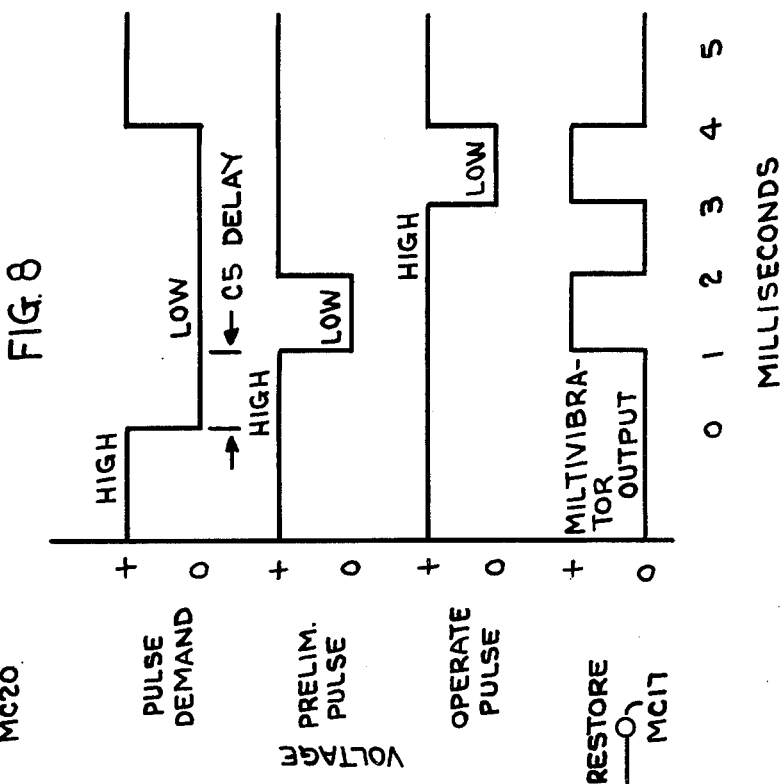
FIG. 8
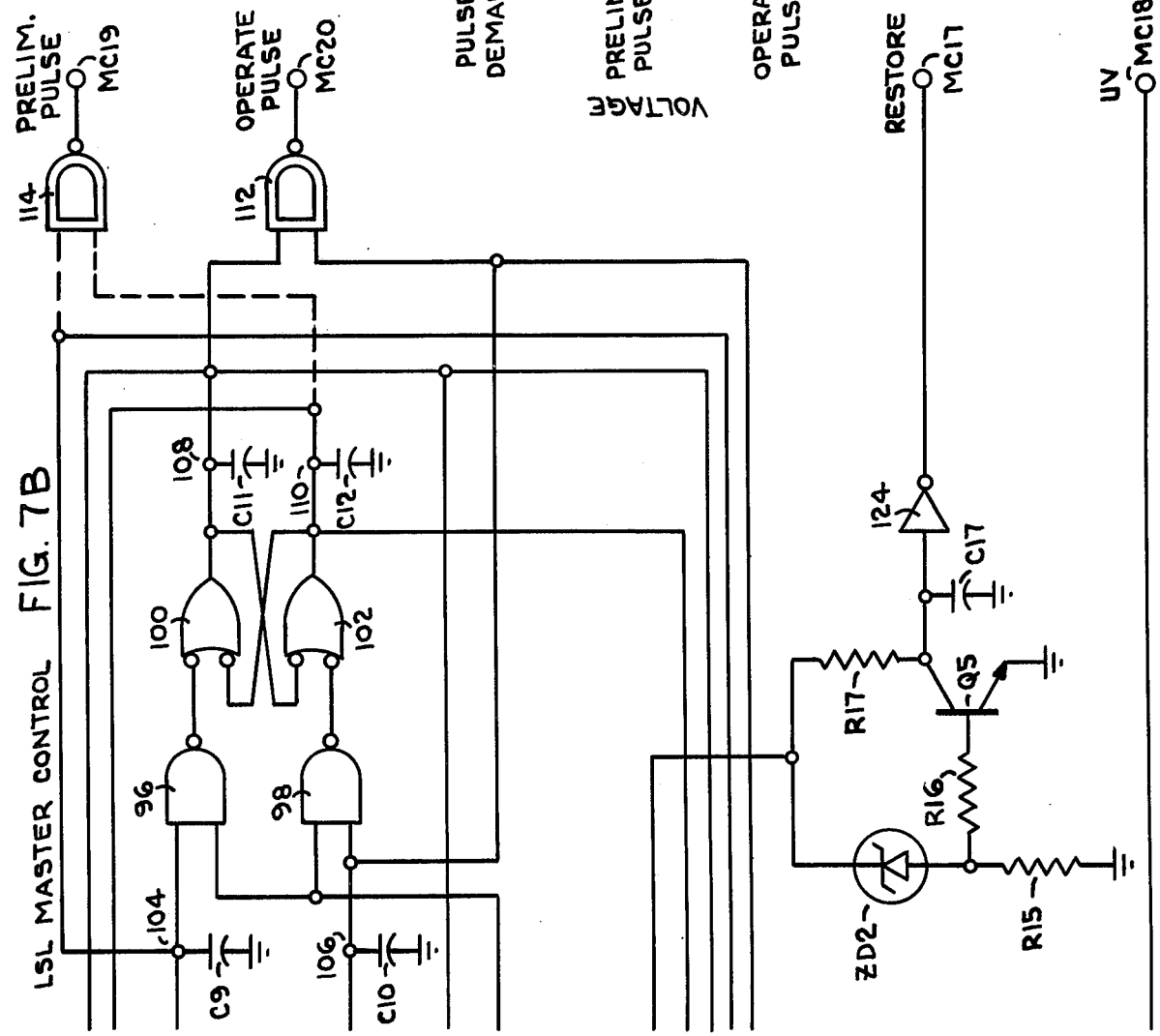
FIG. 7B LSL MASTER CONTROL

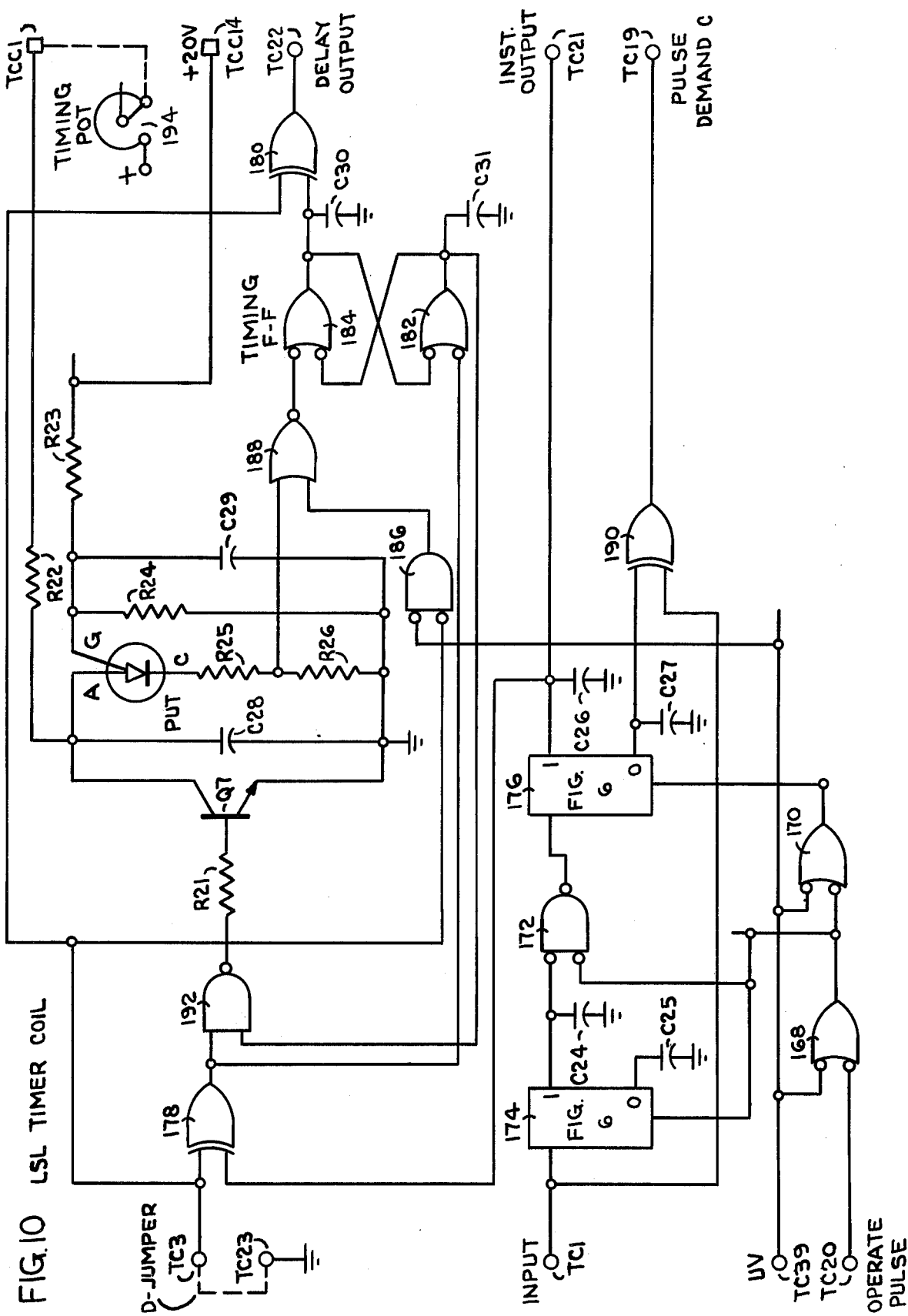
FIG. 10 LSL TIMER COIL

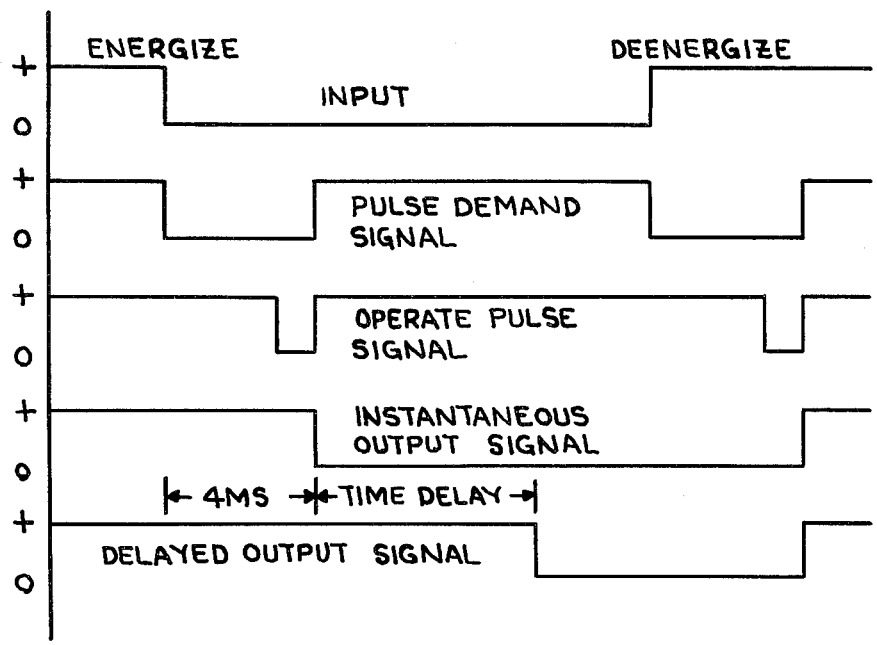
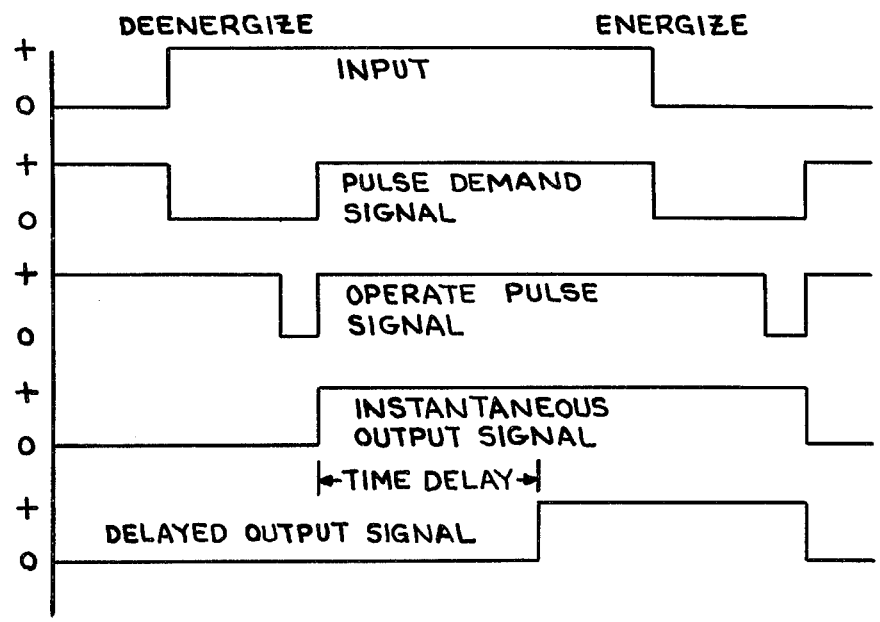

FIG. 13

BUCKET  A   SLOT  1

| | PIN | WIRE NO. | | PIN | WIRE NO. |
|---|---|---|---|---|---|
| | 1 | XXXX | | 21 | XXXX |

| | | PIN | WIRE NO. | | PIN | WIRE NO. | |
|---|---|---|---|---|---|---|---|
| | | 11 | XXXX | | 31 | XXXX | |
| PULSE DEMAND | A | 12 | 9001 | | 32 | XXXX | |
| | B | 13 | 9002 | | 33 | XXXX | |
| | C | 14 | 9003 | | 34 | XXXX | |
| | D | 15 | 9004 | | 35 | XXXX | |
| | | 16 | XXXX | | 36 | XXXX | |
| RESTORE | | 17 | 9005 | | 37 | XXXX | |
| UNDERVOLTAGE | | 18 | 9006 | | 38 | XXXX | |
| | | 19 | XXXX | | 39 | XXXX | |
| OPERATE PULSE | | 20 | 9000 | | 40 | 0001 | LOGIC COMMON |

└── PIN NUMBER ──┘

LSL MASTER CONTROL BOARD

FIG. 22

| WIRE NO. | TERMINALS | | | | | | | |
|---|---|---|---|---|---|---|---|---|
| 00 | | | | | | | | |
| 0001 | A1-40 | A2-1 | A3-1 | A3-2 | A3-3 | | | |
| 02 | | | | | | | | |
| 0003 | A2-2 | A2-21 | A3-21 | | | | | |
| 0004 | A2-22 | A5-1 | | | | | | |
| 0005 | A3-22 | A8-1 | | | | | | |
| 0006 | A2-3 | A2-4 | A3-4 | A3-5 | A3-7 | A3-9 | A3-23 | A4-1 |
| 0007 | A3-25 | A4-5 | | | | | | |
| 0008 | A4-25 | A9-1 | | | | | | |
| 09 | | | | | | | | |
| 0010 | A4-3 | A4-21 | | | | | | |
| 0011 | A4-23 | A9-2 | | | | | | |
| 12 | | | | | | | | |
| 0013 | A3-24 | A4-4 | A4-6 | | | | | |
| 0014 | A3-13 | A4-26 | | | | | | |
| 0015 | A3-33 | A6-1 | | | | | | |
| 0016 | A3-11 | A4-24 | | | | | | |
| 0017 | A3-31 | A6-2 | | | | | | |
| 0018 | A2-23 | A5-2 | | | | | | |
| 0019 | A2-24 | A5-3 | | | | | | |
| 0020 | A3-29 | A7-1 | | | | | | |
| 0021 | A3-27 | A7-4 | | | | | | |
| 22 | | | | | | | | |
| 23 | | | | | | | | |
| 24 | | | | | | | | |

FIG. 23

| WIRE NO. | TERMINALS | | |
|---|---|---|---|
| 00 | | | |
| 5001 | A3-17 | A3-18 | A5-21 |
| 02 | | | |
| 5003 | A3-20 | A4-18 | A5-22 |
| 5004 | A3-37 | A4-19 | A5-23 |
| 05 | | | |

FIG. 24

| WIRE NO. | TERMINALS | | |
|---|---|---|---|
| 00 | | | |
| 7001 | A3-38 | A7-22 | |
| 7002 | A3-39 | A7-25 | |
| 03 | | | |
| 04 | | | |
| 05 | | | |

FIG. 25

| WIRE NO. | TERMINALS | | |
|---|---|---|---|
| 00 | | | |
| 01 | | | |
| 8002 | A3-19 | A4-17 | A6-21 |
| 03 | | | |
| 04 | | | |
| 05 | | | |

FIG. 26

| WIRE NO. | TERMINALS | | | |
|---|---|---|---|---|
| 9000 | A1-20 | A5-20 | A6-20 | A7-20 |
| 9001 | A1-12 | A5-19 | | |
| 9002 | A1-13 | A6-19 | | |
| 9003 | A1-14 | A7-19 | | |
| 9004 | A1-15 | | | |
| 9005 | A1-17 | A6-37 | | |
| 9006 | A1-18 | A5-39 | A6-36 | A7-39 |
| 07 | | | | |
| 08 | | | | |
| 09 | | | | |
| 10 | | | | |

FIG. 27C
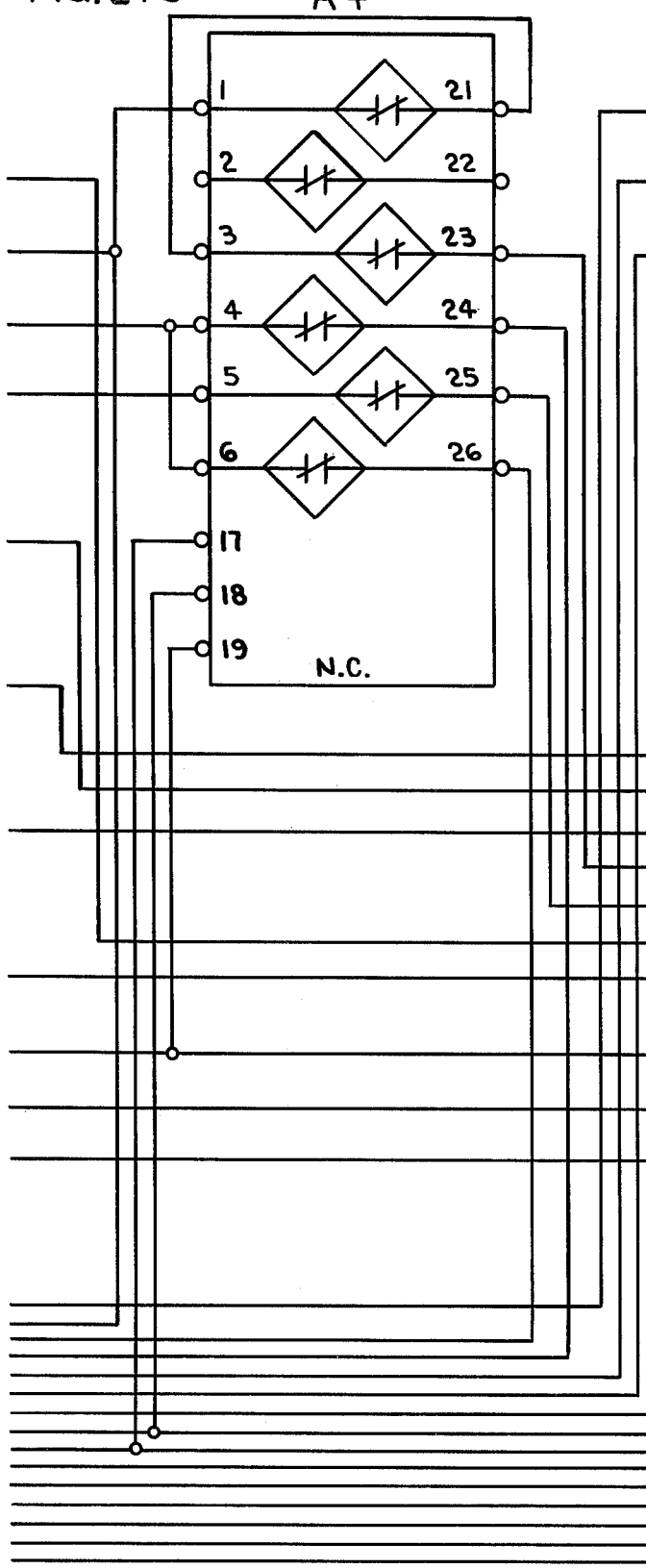
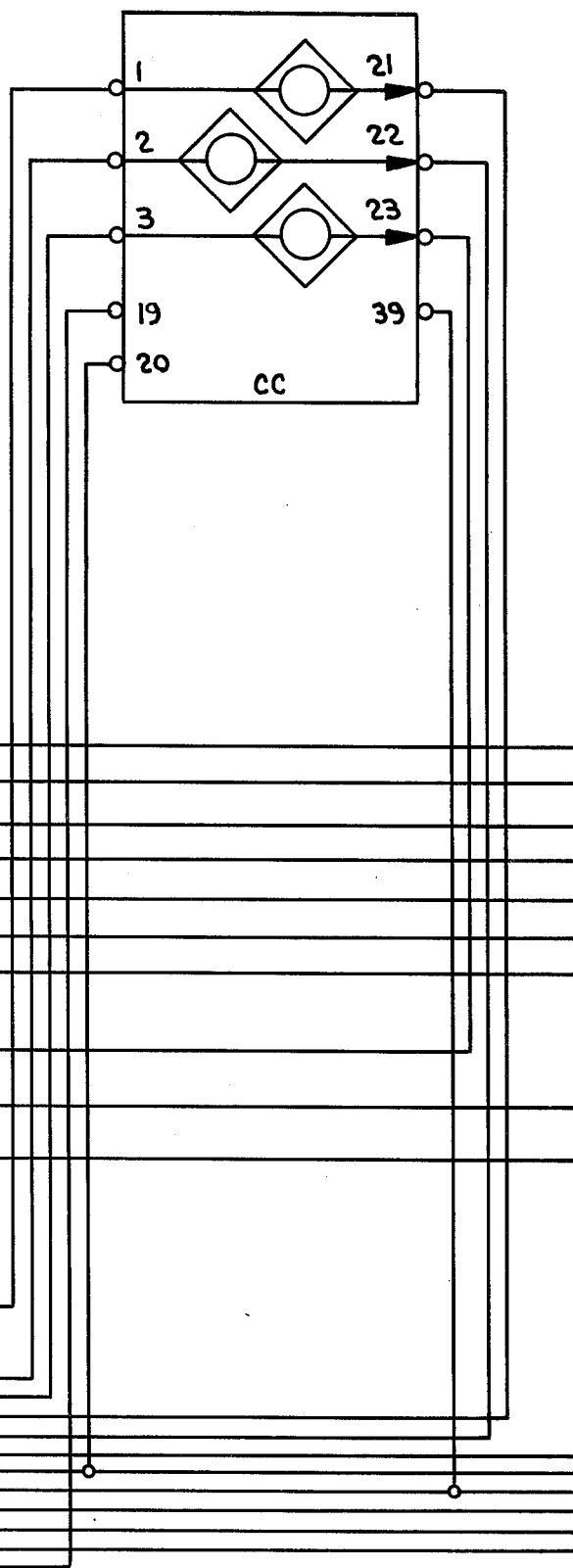

LADDER STATIC LOGIC CONTROL SYSTEM AND METHOD OF MAKING

BACKGROUND OF THE INVENTION

Static logic control systems for performing control functions theretofore performed by electro-mechanical control systems such as relay systems have been known heretofore. However, such static logic control systems have been handicapped in that they look mysterious and unfamiliar to people trained in prior art electro-mechanical control systems, requiring the learning of a complete new technology in order to understand, build, operate and maintain them. Accordingly, it has been found desirable to provide static logic control systems more closely resembling such prior art electro-mechanical control systems.

SUMMARY OF THE INVENTION

This invention relates to ladder static logic circuits and systems and methods of making the latter and more particularly to methods and means which enable a standard relay ladder design to be directly implemented with solid state integrated circuit logic circuits.

An object of the invention is to provide static logic circuits that are logic equivalents of electromagnetic control devices.

A more specific object of the invention is to provide solid state integrated circuit logic circuits that are functional equivalents of electromagnetic control devices including control coils, latching coils and timer coils.

Another object of the invention is to provide a static logic control system that more closely resembles an electromechanical control system as depicted in a standard relay ladder diagram to enable understanding, building, operating and maintaining of the same by those familiar with electro-mechanical control systems.

A more specific object of the invention is to provide a ladder static logic control system having static logic circuits that are logic equivalents of the circuit components of an electromechanical ladder diagram.

A more specific object of the invention is to provide a ladder static logic control system having solid state integrated circuit logic circuits that are the functional equivalents of the circuit components of a standard relay ladder diagram and which enable the latter to be directly implemented thereby.

Another object of the invention is to provide an improved and simplified method of making a static logic control system.

A more specific object of the invention is to provide a method of making a ladder static logic control system.

Another specific object of the invention is to provide a method of making a static logic control system that more closely resembles a standard relay ladder diagram control system.

Another specific object of the invention is to provide an improved method of making a static logic control system incorporating solid state integrated circuit logic circuit components that are the functional equivalents of the electromechanical components of a standard relay ladder diagram and can be directly implemented therefrom.

Other objects and advantages of the invention will hereinafter appear.

BRIEF DESCRIPTION OF THE DRAWINGS

FIGS. 7A-B show a ladder static logic master control circuit that supplies control signals to the circuits in FIGS. 5, 9 and 10;

FIG. 8 is a graph showing operating characteristics of the circuit of FIGS. 7A-B;

FIG. 10 is a ladder static logic timer coil circuit that includes the logic functional equivalent of one timer coil;

FIG. 10A is a graph showing operating characteristics of the circuit of FIG. 10 operating as an E-timer;

FIG. 10B is a graph showing operating characteristics of the circuit of FIG. 10 operating as a D-timer;

FIGS. 13-21 are ladder static logic connection charts used in the method of making the ladder static logic control system;

FIGS. 22-26 are ladder static logic wiring lists used in the aforesaid method; and FIGS. 27A-E show the ladder static logic control system.

DESCRIPTION OF THE PREFERRED EMBODIMENT

Figure 1:
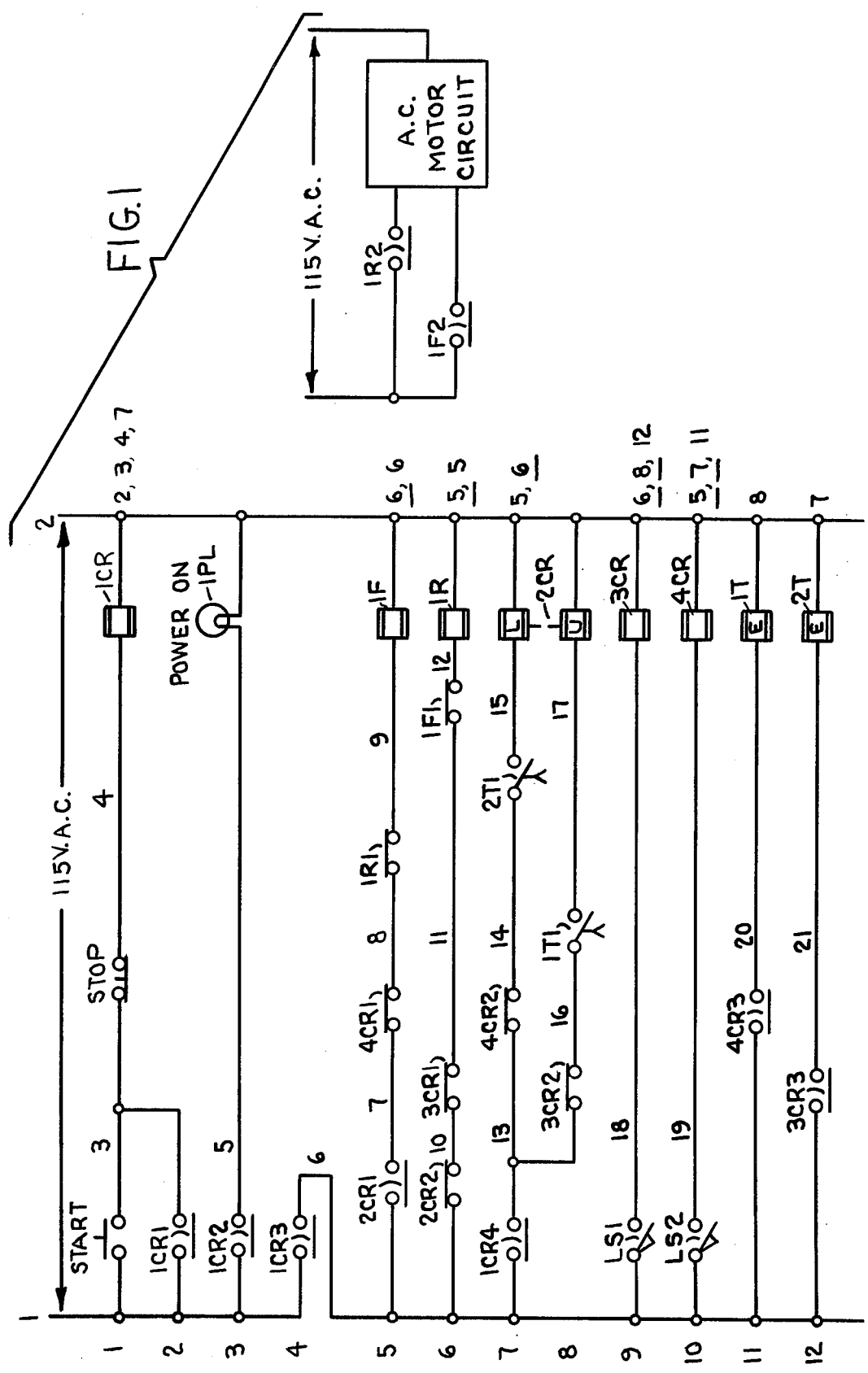
FIG. 1 is a standard relay ladder diagram.

Generally, the invention involves a method of and means whereby a standard relay ladder design, such as for example, that shown in the conventional ladder diagram of FIG. 1 can be easily and simply converted into a static logic system such as that shown in FIGS. 27A-E. The ease and simplicity of this conversion is brought about because there are provided static logic circuit components that are functional equivalents, component for component, of the relay components in the standard relay ladder diagram to make a direct conversion possible. "Relay components" is used herein to include generically the various electrical, mechanical and magnetic components such as manual and mechanical switches, electromagnetic control relay coils, latching relay coils and timer relay coils and contacts, etc., that are used control devices, exclusive of the power devices such as power contactors and the like.

This functional equivalency simplifies the understanding, building, operation and maintenance of ladder static logic systems because they become similar to electromechanical systems. Thus, it reduces the restraining of personnel to a minimum and eliminates the need for learning the esoteric principles of the static logics art that would otherwise be necessary.

STANDARD RELAY LADDER DIAGRAM - FIG. 1

Referring to FIG. 1, there is shown a standard relay ladder diagram. For purposes of illustrating the invention, a simple motor control system has been selected. This motor control system upon being started runs the motor in one direction to its limit of travel whereupon a limit switch closes. This causes power to be cut off from the motor and a timer is started. The motor coasts to a stop during the timed interval whereafter the motor is energized for operation in the reverse direction. The stopping, timing and reversing is then repeated at the limit of travel in each direction.

For this purpose, the motor control system is supplied from an alternating current source at power supply lines 1 and 2. When the START switch is momentarily pressed, control relay coil 1CR is energized through the normally-closed STOP switch. This control coil closes contact 1CR1 for self-maintaining across the START switch, closes contact 1CR2 to light power-on lamp LP, closes contact 1CR3 to apply power to the remainder of the control system, and closes contact 1CR4 in the circuit of latching relay coil 2CR.

The aforesaid application of power to the remainder of the control system energizes reverse contactor 1R through normally-closed contacts of forward contactor 1F, control relay 3CR and latching relay 2CR. Contactor 1R opens interlock contact 1R1 in the forward contactor circuit and closes contact 1R2 in the A.C. motor circuit that is also supplied from an alternating current source as shown at the right-hand portion of FIG. 1. This starts the motor running in the reverse direction.

When the motor has reached its limit of rotation in the reverse direction, limit switch LS1 is closed by the motor drive to energize the coil of control relay 3CR. This control coil opens contact 3CR1 to deenergize reverse contactor 1R, opens contact 3CR2 to prevent energization of unlatching coil U of latching relay 2CR and closes contact 3CR3 to energize the coil of timer relay 2T.

The aforesaid deenergization causes reverse contactor coil 1R to open contact 1R2 to interrupt reverse energization of the A.C. motor circuit to allow the motor to coast to a stop, and to reclose interlocking contact 1R1 in the forward contactor circuit.

The aforesaid energization caused timer coil 2T to start timing for a time interval long enough, for example, for the motor to come to a stop before power is applied for operation in the opposite direction. Timer coil 2T, upon timing out, closes contact 2T1 to energize latch coil L of latching relay 2CR. As a result, latch coil 2CR closes contact 2CR1 to energize the coil of forward contactor 1F, and opens contact 2CR2 to prevent concurrent energization of reverse contactor 1R.

Upon being energized as aforesaid, forward contactor 1F opens interlocking contact 1F1 in the reverse contactor circuit, and closes contact 1F2 to start the motor in the forward direction.

When the motor starts rotating in the forward direction, limit switch LS2 reopens to deenergize control relay 3CR and close contacts 3CR1 and 3CR2, and reopen contact 3CR3 to deenergize timer coil 2T. This timer coil reopens contact 2T1 to deenergize latch coil L without effect as latching relay 2CR remains latched until unlatched by coil U.

At the end of forward travel of the motor load, limit switch LS2 is closed to energize the coil of control relay 4CR. This relay opens contact 4CR1 to deenergize forward contactor 1F, opens contact 4CR2 in the latch coil circuit, and closes contact 4CR3 to start timer coil 1T timing. The motor now comes to a stop whereupon timer coil 1T closes contact 1T1 to energize unlatch coil U of latching relay 2CR. This causes relay 2CR to reopen contact 2CR1 in the forward contactor circuit, and reclose contact 2CR2 to energize the reverse contactor.

The above operations repeat to run the motor first in one direction and then in the other direction until the stop switch is pressed. The stop switch deenergizes control relay 1CR to disconnect power from the control circuit and stop the motor.

LSL DIAGRAM - FIGS. 2A-C

The ladder static logic diagram shown in FIGS. 1A-B comprises a D.C. power input section at the left-hand side, a logic section at the middle, and a D.C. power output section at the right-hand side. As indicated therein, the power input is preferably at a plus 24 volts D.C. level, the logic is preferably at a 0 to plus 5 volts D.C. voltage level, and the power output is preferably at a plus 24 volts D.C. level.

Figure 2A:
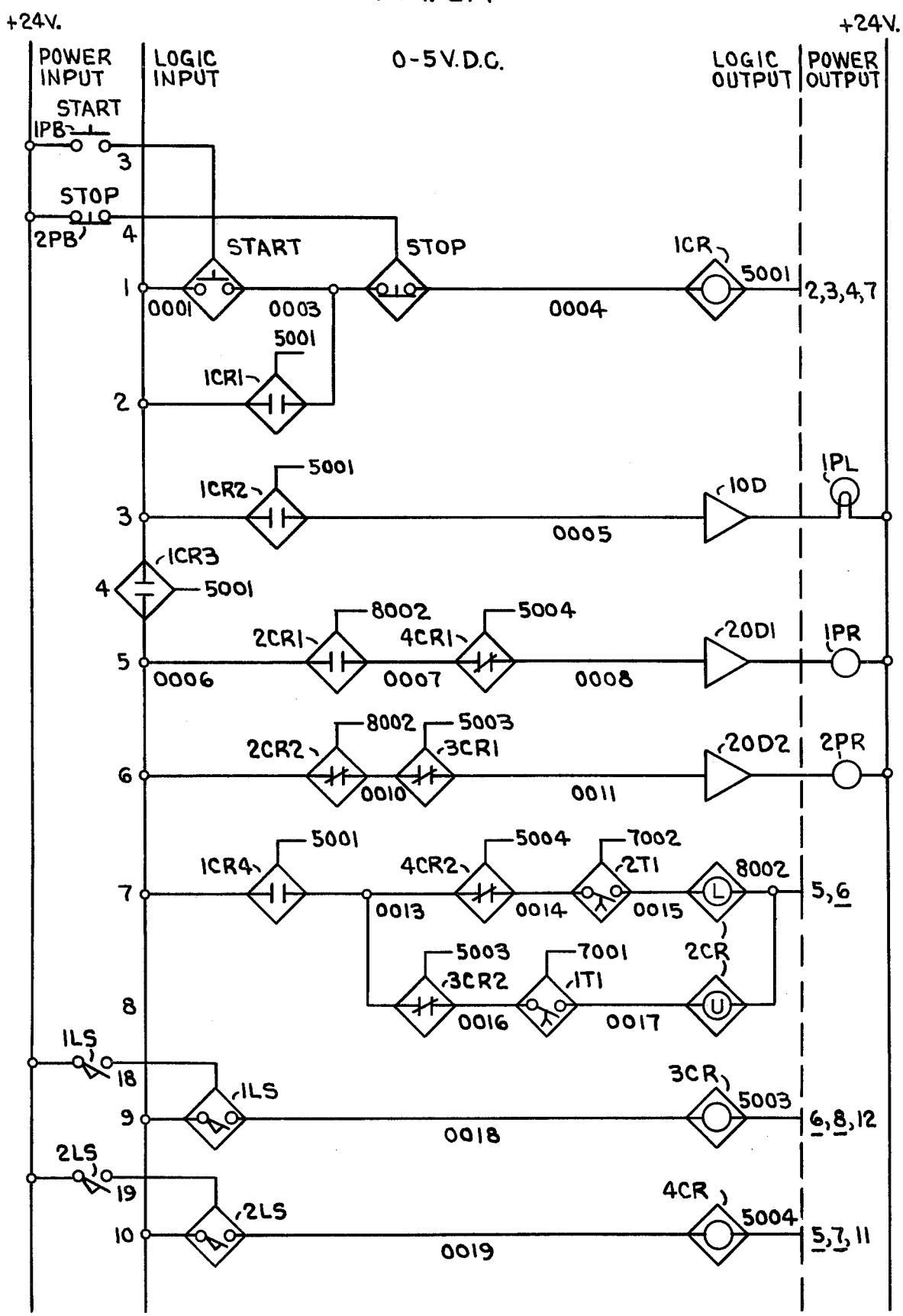
FIG. 2A-C show a schematic ladder logic diagram of the standard relay ladder diagram of FIG. 1 with the input, the logic, and the output separated by two vertical lines.
Figure 2B:
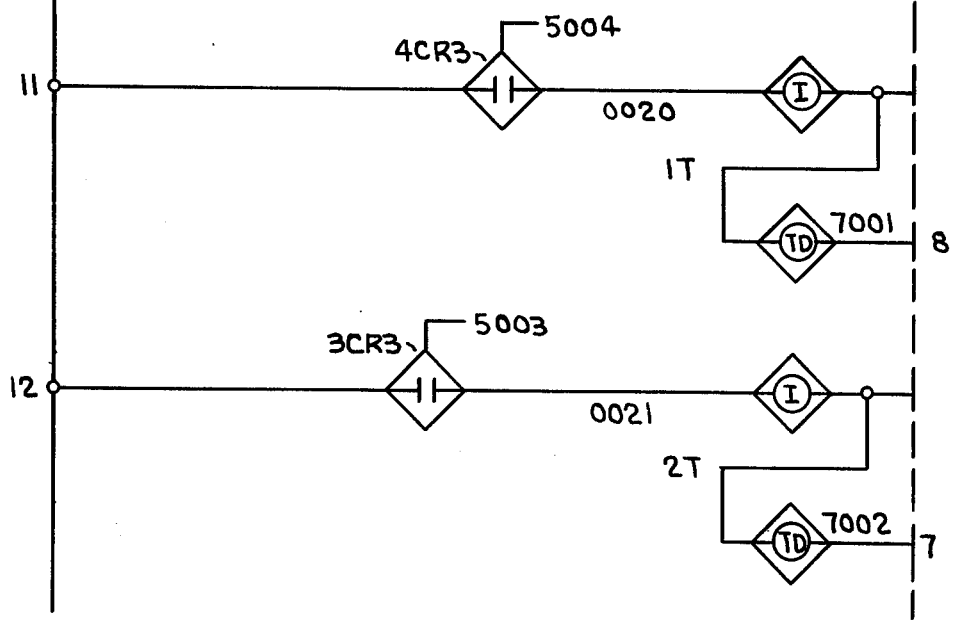
Figure 2C:
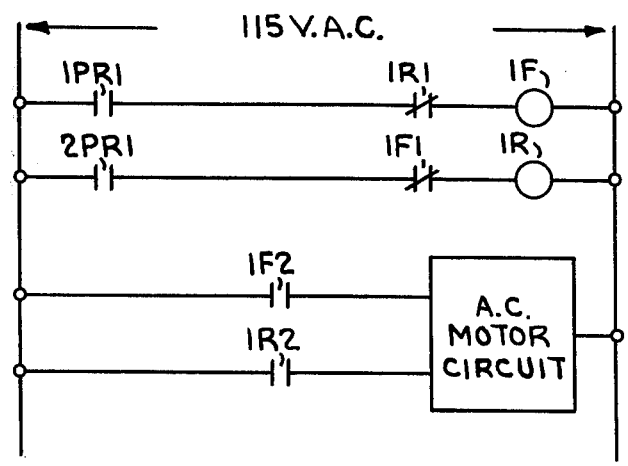

The power elements of the LSL diagram are at a 115 volts A.C. level as shown in FIG. 2C, the same as they are in the relay ladder diagram in FIG. 1.

In the process of making the LSL control system of FIGS. 27A-E, the relay ladder diagram of FIG. 1 is first converted to a ladder static logic diagram as shown in FIGS. 2A-C.

For this purpose, all of the control components of FIG. 1 are given equivalent static logic circuits as shown at the middle section of FIGS. 2A-B. This static logic section is defined by a vertical line at the left marked "logic input" and a broken vertical line at the right marked "logic output" and the logic signals flow from left to right. Each such static logic equivalent circuit is represented by a graphical symbol enclosed in a square, with this square oriented so that it rests on one corner. Thus, the start and stop and limit switches are represented by switching contact static logic symbols including pushbutton symbols enclosed in squares for the start and stop switches and limit switch symbols enclosed in squares for limit switches 1LS and 2LS. A coil symbol (circle) enclosed in a square is used for each control coil 1CR, 3CR and 4CR. A pair of latching coil symbols (circles having an L for latch and a U for unlatch) enclosed in respective squares are used for latching coil 2CR. A pair of timer coil symbols (circles having I for instantaneous and TD for time delay) enclosed in respective squares are used for each timer coil 1T and 2T. The logic outputs of the coils are depicted by lines extending to the right therefrom to a vertical broken line marked logic output. A normally-open contact symbol (two short spaced lines) enclosed in a square is used for each N.O. contact 1CR1-4 for control relay 1CR, 2CR1 for latching rely 2CR, 3CR3 for control relay 3CR, and 4CR1 and 4CR3 for control relay 4CR. A normally-closed contact symbol (two short spaced lines and a diagonal line thereacross) enclosed in a square is used for N.C. contact 2CR2 for latching relay 2CR, 3CR and 3CR2 for control relay 3CR, and 4CR2 for control relay 4CR. A normally-open timer contact symbol enclosed in a square is used for contact 1T1 of timer coil 1T and contact 2T1 of timer coil 2T. The arrow pointed toward closing in this open contact symbol indicates that this is an E-Timer (delay on energization) and that this contact is a timed closing contact. An output driver symbol comprising a triangle is used for output drivers 10D, 20D1 and 20D2 to increased the voltage level for the load devices. The coils and contacts are connected to one another and to the logic input vertical line by lines representing wires as in the relay ladder diagram. And each contact symbol has a control input from its associated coil as hereinafter described.

In the D.C. power input section at the left-hand side in FIG. 2A, start pushbutton switch 1PB is connected from the plus 24 volts supply to the start switch logic symbol to depict the control applied to the latter. In a similar manner, stop pushbutton switch 2PB is connected from the plus 24 volts supply to the stop switch logic symbol to depict the control applied to the latter. Also, limit switches 1LS and 2LS are connected from the plus 24 volts supply to the respective limit switch logic symbols to depict the controls applied to the latter.

In the power output section at the right-hand side of FIG. 2A, a power-on indicator lamp 1PL is connected from output driver 10D to a plus 24 volts supply. Also, power reed relays 1PR and 2PR are connected from output drivers 20D1 and 20D2, respectively, to the plus 24 volts supply.

As also shown in FIGS. 2A-B, each horizontal line having at least one logic element is given a horizontal line number 1-12 adjacent the logic input vertical line. Each coil is given one or more numbers adjacent the logic output vertical broken line to indicate the lines on which contacts associated with the coil are to be found, a plain number indicating a normally-open contact and an underlined number indicating a normally-closed contact. The wire numbers of the relay ladder diagram are changed to four-digit numbers of the same value such as 0001, 0003, etc. and transferred to the equivalent wires in the LSL schematic diagram in FIG. 2A.

The aforementioned power elements of the ladder diagram are shown in FIG. 2C. These power elements include forward contactor coil 1F, reverse contactor coil 1R, and the A.C. motor circuit. These power elements are supplied with power from a 115 volt A.C. source. The coil of forward contactor 1F is controlled by a normally-open contact 1PR1 of power reed relay 1PR.

In this connection, it will be noted that whereas all the control elements and power elements in the standard relay ladder diagram of FIG. 1 are supplied with power from a 115 volt A.C. source, the ladder static logic system schematically shown in FIGS. 2A-C uses two output power voltages. Thus, load devices such as indicator lamps and the like are energized with 24 volt D.C. power, and an output driver is used to raise the logic level voltage to this 24 volt D.C. power output voltage. Then to control power devices at a 115 volt A.C. voltage level, power reed relays are used as amplifiers to raise the power level from the 24 volts D.C. to the 115 volts A.C.

In the same manner, the coil of reverse contactor 1R is controlled by a normally-open contact 2PR1 of power reed relay 2PR. A normally-closed reverse contactor contact 1R1 is in the forward contactor circuit and a normally-closed forward contactor contact 1F1 is in the reverse contactor circuit for interlocking purposes. The forward and reverse contactors have additional normally-open contacts 1F2 and 1R2 for controlling forward and reverse directional energizations of the A.C. motor circuit.

BASIC LOGIC SIGNAL

All LSL logic elements are controlled by voltages that are positive with respect to D.C. common (ground). The logic signal consists of two voltage ranges corresponding respectively to the energized and de-energized states of relay signals. The logic signal corresponding to the energized state is a "low" voltage, ranging from plus 0.6 volt down. The logic signal corresponding to the de-energized state is a "high" voltage, ranging from plus 2.4 volts to plus 5 volts. Any voltage between plus 0.6 volt and plus 2.4 volts is neither a low nor a high signal and indicates a malfunction such as an undervoltage (UV) condition.

All LSL logic elements are amplifiers which completely restore the voltage levels of input signals. Thus, there is no limit to the number of logic elements that may be connected in series, in contrast to relay components where signal deterioration in series connected components must be considered. However, there are limitations on the number of logic elements that may be connnected in parallel but this can be increased by the use of "repeater" contacts. Such repeater contacts act as amplifiers. For example, a normally open contact logic circuit can feed a group of a predetermined maximum number of parallel logic elements. To feed an additional group of parallel elements, a normally closed repeater contact logic is connected beyond the first group in series with the normally open contact logic circuit. The control input of the normally closed contact logic is left unconnected so that it is permanently unenergized.

EQUIVALENT LOGIC CIRCUITS

Logic circuits which are the functional equivalents of the various relay circuit components of FIG. 1 are shown in FIGS. 3-5, 7A-B, 9, 10 and 11. These logic circuits will now be individually described.

LSL N.O. CONTACTS CIRCUIT - FIG. 3

Figure 3:
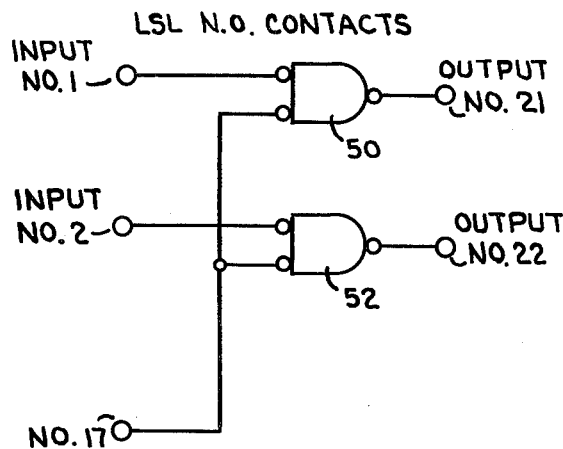
FIG. 3 is a ladder static logic normally-open contacts circuit that includes the logic functional equivalent of two normally-open contacts arranged for operation by one control coil.

FIG. 3 shows the ladder static logic normally-open contacts equivalent circuit. This logic circuit has been arranged to have two normally-open contacts arranged for operation by a single coil input. Each contact comprises a two-input AND logic. Thus, the input signal to be passed therethrough is applied from a first input terminal NO1 to one input of AND logic 50 and the output of this AND logic is connected to output terminal NO21. A control input which is the equivalent of a coil action is applied from control terminal NO17 to the other input of AND logic 50. Thus, it will be apparent that whenever the coil is energized (low signal on terminal NO17), the contact is closed (logic 50 is gated), so that a signal (low) on input terminal NO1 will pass through to output terminal NO21.

In a similar manner, the second normally-open contact function is provided by a second AND logic 52 having its two inputs connected to input terminal NO2 and control terminal NO17, respectively, and having its output connected to output terminal NO22. Thus, a low signal on control terminal NO17 will gate both AND logics so that they will pass input signals present on either or both input terminals NO1, NO2.

These contact logics may be connected in series, exactly as relay contacts are interconnected, and any number may be wired in series. Either the inputs or outputs of these contact logics may also be wired in parallel to give the equivalent switching action given by relay contacts wired in parallel.

Figure 14:
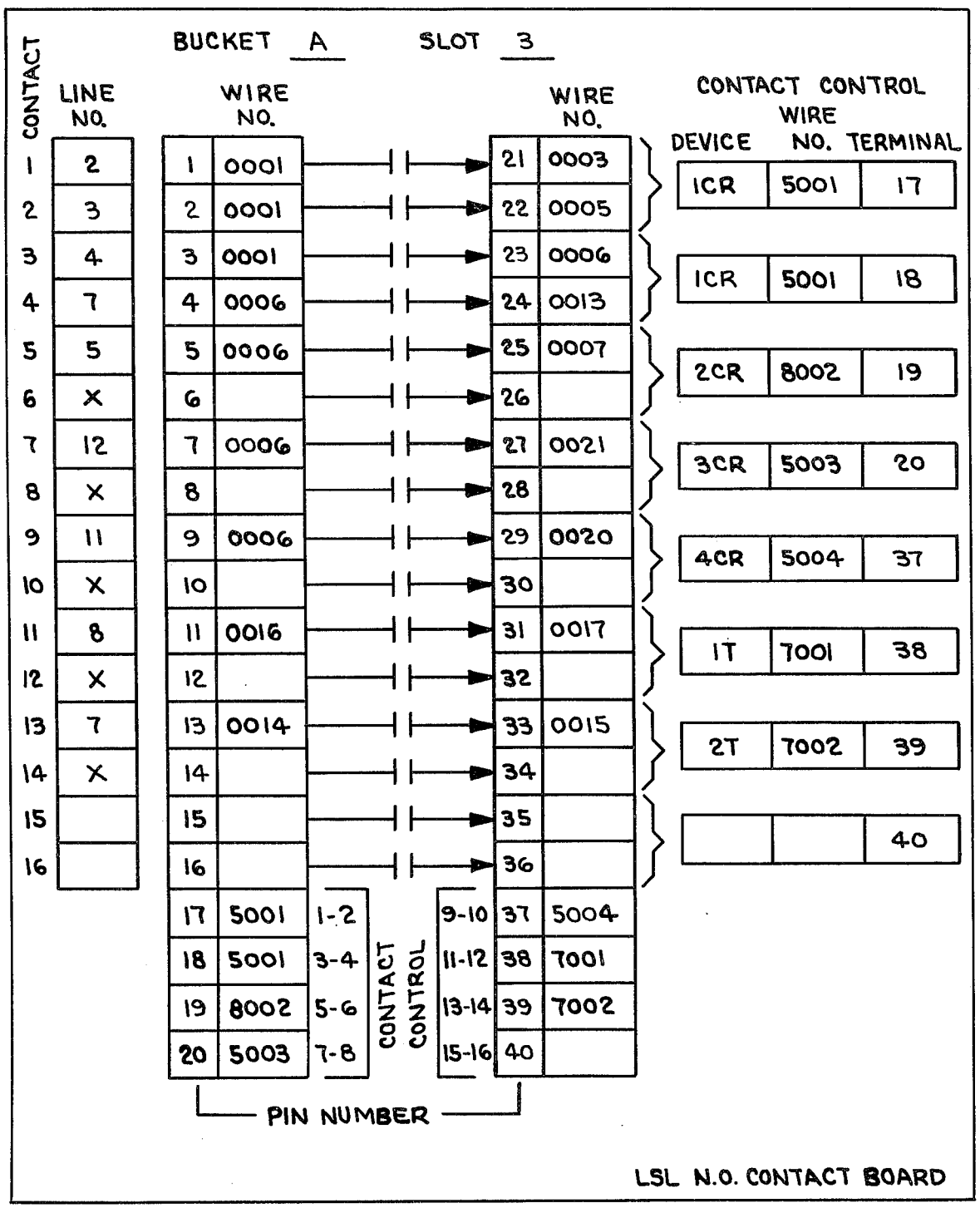

As a practical matter, the normally-open contacts logics are integrated circuit logics and are mounted on a standard printed circuit (PC) board having terminals at the back whereby it may be plugged into a logic bucket. Logics for sixteen normally-open contacts are mounted on a single PC board and they are controlled in pairs by eight coil inputs as shown in FIGS. 14 and 27B-C. The normally-open contacts inputs are numbered NO1-NO16, their outputs are numbered NO21-NO36, and their control inputs are numbered NO17-NO20 and NO37-NO40. Thus, control input NO17 controls contact inputs NO1-2, control input NO18 controls contact inputs NO3-4, etc. If a coil input has only one normally-open contact to be controlled, its other normally-open contact is left unused.

LSL N.C. CONTACTS CIRCUIT - FIG. 4

Figure 4:
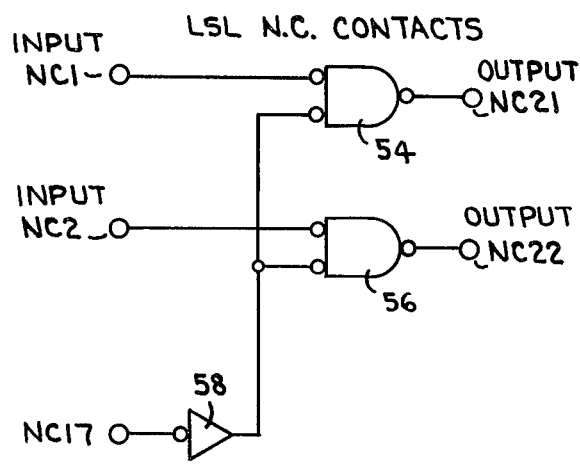
FIG. 4 is a ladder static logic normally-closed contacts circuit that includes the logic functional equivalent of two normally-closed contacts arranged for operation by one control coil.

FIG. 4 shows the ladder static logic normally-closed contacts equivalent circuit. This circuit has two AND logic 54 and 56 each having two input and an output, one input thereof being connected to input terminals NC1 and NC2 and their outputs being connected to output terminals NC21 and NC22. Control coil input terminal NC17 is connected through an inverter 58 to the other inputs of AND logics 54 and 56.

It will be apparent that the normally-closed contacts logic differs from the normally-open contacts logic only in the addition of the inverter in the control input.

Thus, when there is no control coil input (high) at terminal NC17, the AND logics will be gated (low) so that an input signal (low) at either terminal will pass through. When a control coil signal is applied to terminal NC17 (low), inverter 58 will apply high signals to the AND logics so that no input signal can pass through.

At this time, it should be stated that the small circles on the logics indicate that "low" is significant. That is, on AND logic 54, a low signal at both inputs will cause a low signal to appear at its output. A high on either input will keep the output at high. A low on the input of inverter 58 will cause a high (no small circle) to be applied therefrom to open the normally-closed contacts (ungate the normally-gated AND logics) so that no signal can pass through either one.

Figure 15:
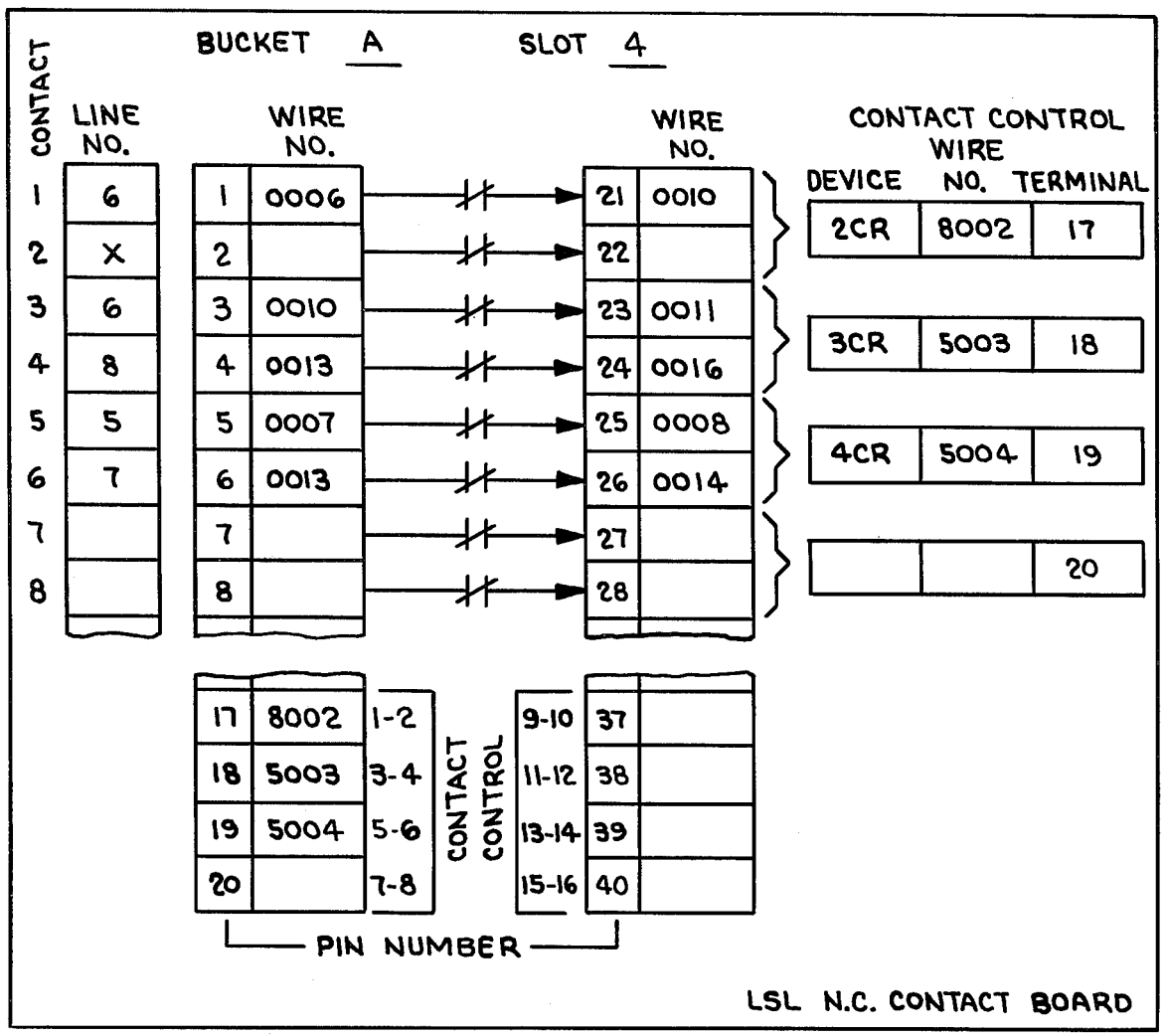
Figure 27A:
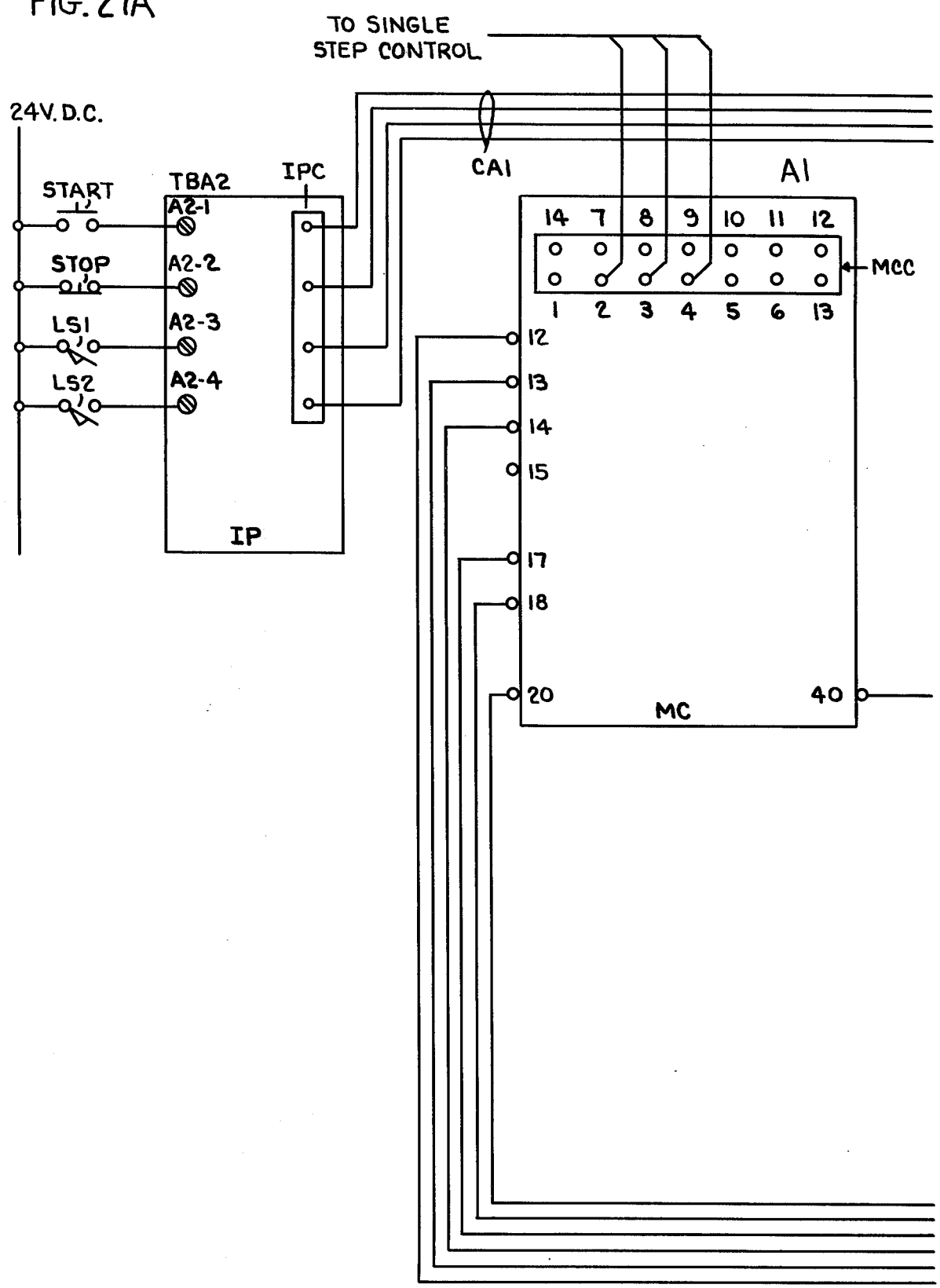
Figure 27B:
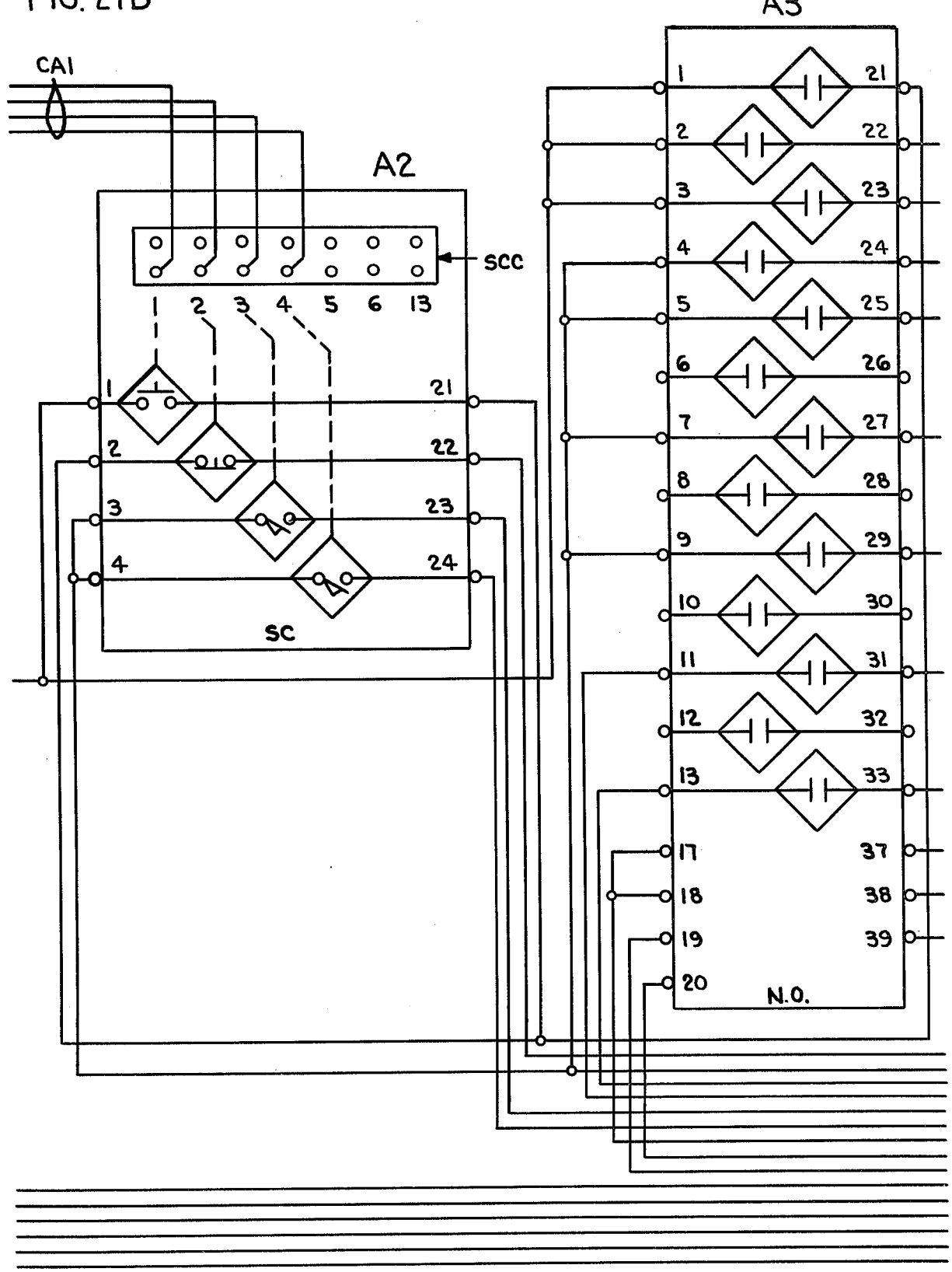
Figure 27D:
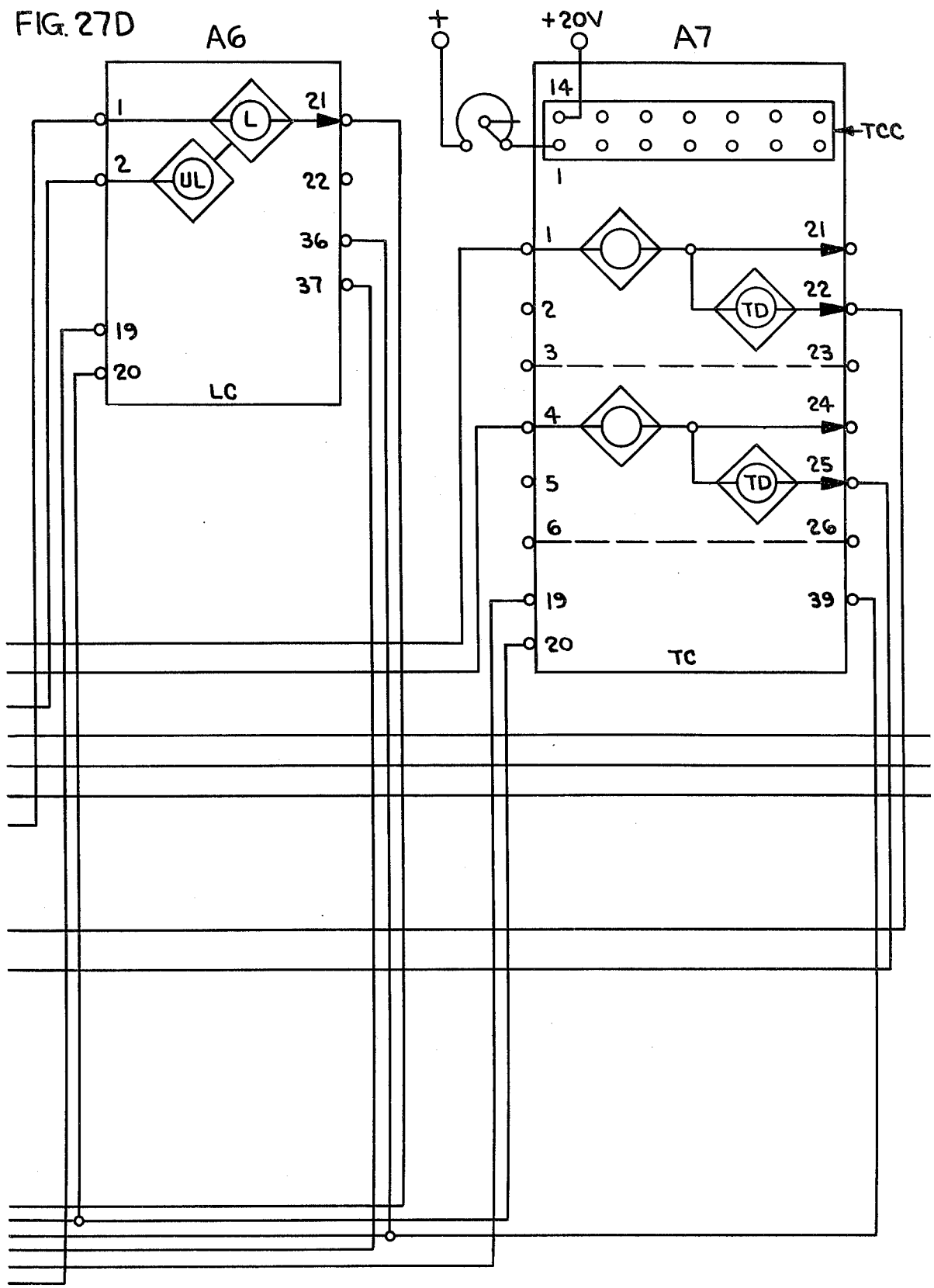

These normally-closed contacts logics are arranged and mounted on standard PC boards like the N.O. contacts logics hereinbefore described, and the terminals are similarly numbered except using the NC prefix for normally-closed as shown in FIGS. 15 and 27C-D.

These contact logics may be connected in series, exactly as relay contacts are interconnected, and any number may be wired in series. Either the inputs or outputs of these contact logics may also be wired in parallel to give the equivalent switching action given by relay contacts wired in parallel.

LSL CONTROL CIRCUIT - FIG. 5

Figure 5:
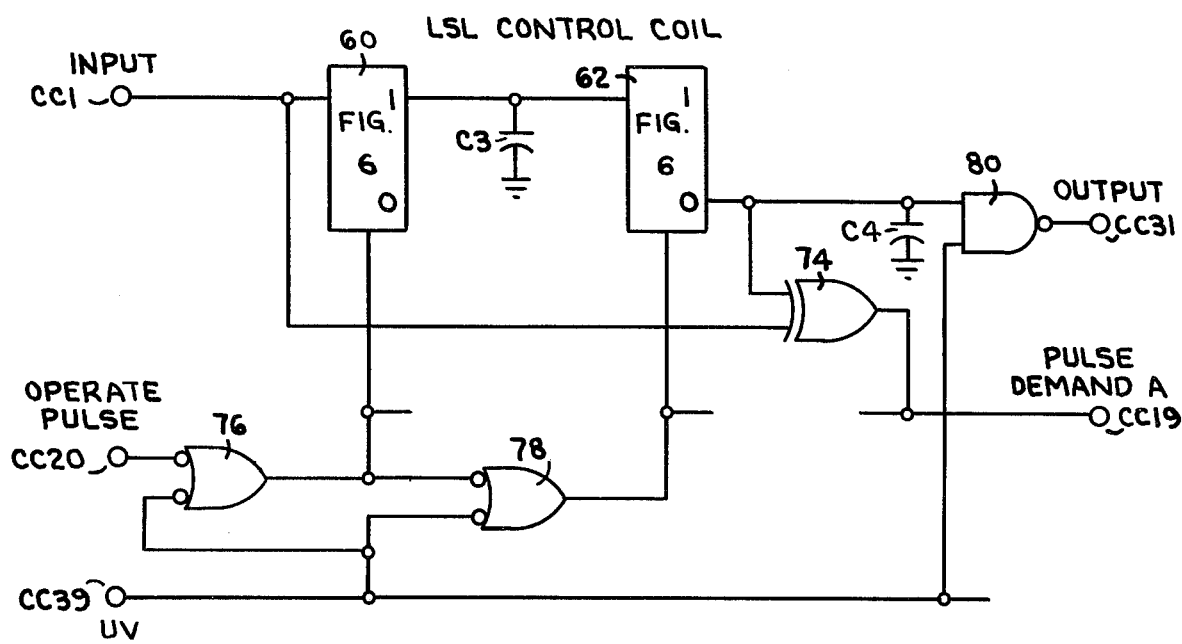
FIG. 5 is a ladder static logic control coil circuit that includes the logic functional equivalent of one control coil.

FIG. 5 shows the ladder static logic control coil circuit. This circuit is the functional equivalent of an electromagnetic relay coil when used in connection with the LSL master control hereinafter described. Generally, when an input signal is applied to this LSL control coil circuit, it sends out a pulse demand signal if the output signal does not agree with the input signal. This pulse demand signal goes to the LSL master control circuit. This pulse demand signal operates the master control circuit to cause it to send back a time-delayed operate pulse which is the functional equivalent of the time it takes an electromagnetic relay to operate. This operate pulse causes the LSL control coil logic to provide and output signal which is used to control the aforementioned LSL normally-open and normally-closed contacts logics.

This LSL control coil logic circuit not only provides a time delay similar to a conventional relay, but also has a precise and uniform time delay to facilitate system sequencing and to eliminate logic "races". It also emulates a relay coil in rejecting high frequency signals, thus providing the LSL control system with a noise immunity characteristic.

Referring to FIG. 5, the control coil logic circuit comprises two flip-flops or memory elements including an input flip-flop 60 and an output flip-flop 62 shown as rectangles. As indicated on these rectangles, the circuit thereof is shown in FIG. 6.

Figure 6:
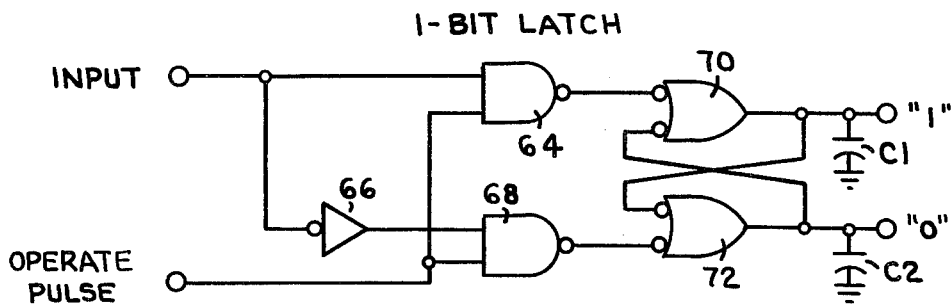
FIG. 6 is a static logic circuit of a 1-bit latch used in the circuit of FIG. 5.

Referring to FIG. 6, there is shown the flip-flop 60 of FIG. 5 in the form of a 1-bit latch having a signal input terminal, an operate pulse input terminal, and a 1-bit output consisting of 1 and 0 bit output terminals, so designated in the drawing.

To consider the operation of this 1-bit latch circuit, assume initially that the input terminal is normally at high, the operate pulse terminal is normally at low and the flip-flop is in its off state wherein the 1 terminal is at high and the 0 terminal is at low. Under this condition, the output of AND logic 64 will be high since it has high and low inputs and requires two high inputs for its output to go low. NOT logic 66 inverts the high input to a low at one input of AND logic 68. Consequently, the output of logic 68 will also be high. The high at the output of OR logic 70 is applied through the cross-connection so that OR logic 72 has highs at both inputs. The low at the output of logic 72 is applied through the other cross-connection to an input of logic 70 to maintain its output high.

To operate the flip-flop to its on state requires application of a low signal to the input terminal and at the same time to apply a high pulse to the operate pulse terminal. This low is inverted by logic 66 so that there now appears a high signal on both inputs of AND logic 68. As a result, the output of logic 68 goes low and is applied to an input of OR logic 72 to flop the flip-flop to its on state. For this purpose, the low to one input of OR logic 72 causes its output to go high which is applied to the 0 output terminal. This high is also applied through the cross-connection to an input of logic 70. OR logic 70 now has high on both inputs so that its output goes low which is the on state of the flip-flop. Capacitors C1 and C2 connecting the outputs of logics 70 and 72 to ground are provided to suppress noise. To operate the flip-flop in FIG. 6 back to its off state requires application of a high signal to the input terminal and at the same time to apply a high pulse to the operate pulse terminal. This produces highs at both inputs of AND logic 64 to provide a low output therefrom. This low signal goes to one input of OR logic 70 to cause its output to go high. This high at the 1 output terminal is indicative of its off state. Output terminal 0 goes low in a manner which should be apparent from the above.

Referring to FIG. 5, it will be seen that the 1-bit latch of FIG. 6 is used for both input flip-flop 60 and output flip-flop 62, also known as master and slave flip-flops. As shown in FIG. 5, the LSL control coil circuit has a signal input terminal CC1 and a signal output terminal CC31. When an input signal is applied, an output signal appears after a time interval similar to the operation of an electromagnetic relay coil.

To operate the LSL control coil circuit in FIG. 5 to its on state, a low signal is applied to input terminal CC1 and goes to the input of flip-flop 60 and one input of exclusive OR logic 74. This low input signal is shown by the first curve (upper) in FIG. 5A. Assuming that output flip-flop 62 is in its off state, a low signal is applied from its 0 output to the other input of logic 74. Low signals at both inputs cause exclusive OR logic 74 to provide a low signal from its output to pulse demand A output terminal CC19 from where it goes to the master control circuit for return of an operate pulse as hereinafter described. This pulse demand signal is shown by the second curve in FIG. 5A.

Exclusive OR logic 74 functions in FIG. 5 as a coincidence logic, that is, lows at both inputs cause a low at its output. This exclusive OR logic also functions to provide a low at its output when highs are applied to both inputs which is another coincidence function thereof. This logic 74 functions as an exclusive OR logic when a low is applied to only one input. In such case it provides a high signal at its output. This type of exclusive OR logic is used also in the LSL timer coil cicuit of FIG. 10 hereinafter described, so that its two coincidence functions and its single exclusive OR function should be kept in mind.

Returning now to the operation of the LSL control coil circuit in FIG. 5, an operate pulse is applied to terminal CC20 while the low signal is on input terminal CC1. This operate pulse comes from the master control circuit with a time delay of 3 ms after the pulse demand signal as hereinafter described and is shown as a low signal by the third curve in FIG. 5A. This low operate pulse is applied to one input of OR logic 76 which provides a corresponding high pulse to flip-flop 60. This high pulse causes this input flip-flop 60 to be set to its on state whereby a low signal is applied from its 1 bit output to the input of output flip-flop 62, capacitor C3 to ground suppressing noise therein.

Figure 5A:
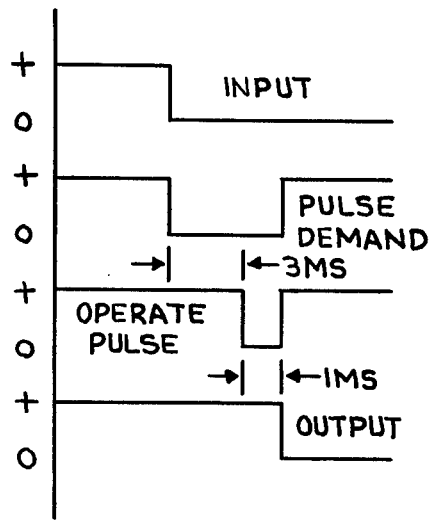
FIG. 5A is a graph showing operating characteristics of the circuit of FIG. 5.

This output flip-flop will be set on the trailing end of the operate pulse. When the operate pulse ends, returning to high as shown in FIG. 5A, the output of OR logic 76 goes low and the output of OR logic 78 goes high. This high is applied to the operate pulse terminal (see FIG. 6) of flip-flop 62 to set the latter to its on state. As a result, a high signal is applied from the 0 bit output of flip-flop 62 to one input of AND logic 80, capacitor C4 to ground suppressing noise therein. Undervoltage terminal CC39 is normally at a high (signal off) voltage that is applied to the other input of AND logic 80. As a result, the output of logic 80 goes low which is applied to output terminal CC31 as an output signal as shown by the last (lowermost) curve in FIG. 5A.

The aforesaid high signal is also applied from the 0 bit output of flip-flop 62 to one input of exclusive OR logic 74. Changing the exclusive OR logic from two low inputs to a low and a high input causes its output to go from low to high to end the pulse demand signal as shown by the second curve in FIG. 5A.

The LSL control coil circuit in FIG. 5 is now in its on state with a low signal at its output which emulates the energized condition of a control relay coil.

The LSL control coil circuit is restored to its off state in a similar manner except controlled by a high input signal. As will be apparent, this off state emulates the de-energized condition of a control relay coil.

For this purpose, the input signal is terminated so that a high appears at input terminal CC1. As a result, highs appear at both inputs of exclusive OR logic 74 to cause it to provide a low output and apply this as a pulse demand A signal to terminal CC19. This pulse demand A signal operates the master control circuit as hereinafter described in connection with FIGS. 7A-B and 8 to apply an operate pulse to terminal CC20 in FIG. 5. This operate pulse will first set flip-flop 60 to its off state in the manner hereinbefore described in connection with FIG. 6. As a result, flip-flop 60 applies a high to the input of flip-flop 62. The trailing end of this operate pulse will then set flip-flop 62 to its off state so that a low appears at its 0 bit output. This low switches the signal at output terminal CC31 back to high and ends the pulse demand A signal, so that the LSL control coil circuit is now in its off state corresponding to a deenergized coil.

Undervoltage (UV) signal terninal CC39 is used to set the LSL control relay circuit to its off state whenever power is applied to the system, this being its normal state. For this purpose, a low signal is applied to terminal CC39. This UV signal is generated in the master control circuit as hereinafter described. This UV signal is a low signal that lasts from the time power is applied to the system and during the momentary rise of the supply voltage to about 4.5 volts D.C. When the voltage rises above this value, the UV signal ends by switching to a high.

This UV signal (low) is applied to an input of OR logic 76 to cause a high output to be applied therefrom to set flip-flop 60 into its off state (high at its 1 bit output) assuming that its input is high during this resetting. At the same time, this low UV signal is applied to an input of OR logic 78 to cause a high output to be applied therefrom to set flip-flop 62 to its off state, upon the high output of the first flip-flop being applied to the input of the second flip-flop. At the same time, the low UV signal is applied to an input of AND logic 80 to switch its output to high that is the off state of the control coil circuit and to block the output during this resetting of the flip-flops. When flip-flop 62 was set into its off state as aforesaid, it applies a low signal from its 0 bit output to the other input of AND logic 80 to maintain the output terminal at high (off state) following termination of the UV signal. When the supply voltage rises to full value, the UV signal ends, goes high, but the LSL control coil circuit remains in its off state. On the other hand, if for some reason the input signal is on (low), the UV signal will cause the two flip-flops to be set to their on states.

As shown in FIG. 5, the upper part of the logic circuit, above the circuit multiples, is individual to a single LSL control coil equivalent function. On the other hand, the lower part of this circuit, below these multiples, and including the operate pulse, UV and demand pulse A terminals are common to a number of control coil logic circuits. The circuit multiples represent possible connections from the four conductors of the common circuit to additional control coil logic circuits.

Figure 16:
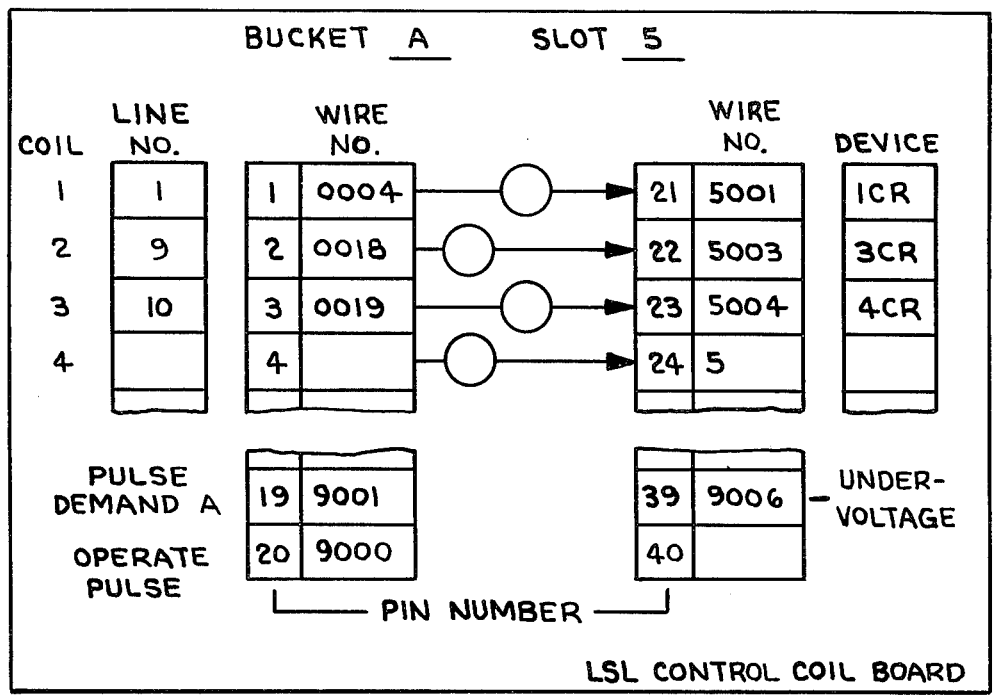

As a practical matter, twelve control coil logic circuits are mounted on one standard PC board of the aforementioned type. The inputs to these control coil logic circuits are numbered CC1-CC12 and the outputs therefrom are numbered CC21-CC32 as shown in FIGS. 16 and 27C. The common circuit terminals are numbered as shown in FIG. 5. The remaining terminals CC13-CC18 and CC33-CC38 on this PC board are used for other purposes not described or illustrated herein to avoid complicating the disclosure.

From the foregoing description of the LSL control coil circuit, it will be apparent that the input flip-flop 60 is set to its on state at the beginning of the operate pulse, and the value in the input flip-flop is transferred to the output flip-flop 62 at the end of the operate pulse, and the output of flip-flop 62 becomes the output of the coil circuit.

In addition, simultaneously with the aforesaid setting of the output flip-flop, the operate pulse terminates as far as the input flip-flop 60 is concerned. This means that the input flip-flop cannot now respond to any "sneak" signals that might be generated at the instant that the signal on output terminal CC31 changes. All of the LSL coil circuits have been arranged to change output signal value precisely at the same time, being controlled from the LSL master control circuit common thereto, this time being the trailing edge of the operate pulse. Consequently, any sneak signals that might be generated will be of an extremely short duration, usually less than one microsecond. This is far shorter than that required to initiate an operate pulse and, thus, provides the race-free operation hereinbefore mentioned.

LSL MASTER CONTROL CIRCUIT - FIGS. 7A-B

The master control circuit shown in FIGS. 7A-B functions in response to a pulse demand input signal to provide timed-delayed, spaced output pulses as shown by the curves in FIG. 8, the second output pulse being applied from terminal MC20 as an operate pulse. The preliminary pulse output is shown in broken lines in FIG. 7B since only the operate pulse is presently used in the LSL system of FIGS. 27A-E. The lines leaving the right side of FIG. 7A connect to the lines at the left side of FIG. 7B.

This master control circuit also includes means to provide an undervoltage signal UV if the logic supply voltage should fall below approximately 90 percent of full value or 4.5 volts. This UV signal is used to force all LSL coil circuits to their normal off states corresponding to de-energized conditions of relays.

This master control circuit also includes means to provide a "restore" signal when the supply voltage is below about 80 percent of full value or 4.0 volts such as when the supply voltage rises on first application thereof or restoration after failure. This restore signal is used to restore the states of latching relays as hereinafter described.

This master control circuit further includes means affording single-step operation when a single-step control unit is connected thereto. Under this condition, this master control circuit is changed from automatic to manual, that is, it will no longer respond to a pulse demand signal to produce an operate pulse, such automatic operation being inhibited, but will instead respond to a manual pushbutton operation to provide an operate pulse. This master control circuit further includes a logic common output terminal.

AUTOMATIC OPERATION

Referring to FIGS. 7A-B, it will be seen that the LSL master control circuit comprises a plurality of pulse demand input terminals MC12-15, one for each class of pulse demand, namely, control coil (A), latching coil (B), and timer coil (C), and a spare (D), respectively, the latter being usable for any of the first three classes if a large number thereof are present in a given system.

An operate pulse signal is produced at output terminal MC20 in response to a pulse demand signal received at one of the terminals MC12-15. Thus, a pulse demand signal (low) at one of these inputs MC12-15 is applied to OR logic 82 which applies a high signal to one input of AND logic 84. This signal passes through AND logic 84 provided that the undervoltage signal at its second input and the step inhibit signal at its third input are both off (high). Then, a low is applied to one input of OR logic 86 causing it to apply a high signal through diode D1 to the base of N-P-N transistor Q1, this high signal being delayed about one millisecond, as shown in FIG. 8, by capacitor C5 that is connected from the output of logic 86 to ground. This high signal turns transistor Q1 on thereby connecting the emitter of transistor Q2 to ground to turn it on by current flow from the positive 5 volt source through resistor R1 and the base-emitter junction of transistor Q2 and the collector-emitter junction of transistor Q1. This pulls the junction between resistor R2, capacitor C6 and the collector of transistor Q2 near ground potential. Since capacitor C6 cannot discharge instantaneously, and was previously charged to the polarily shown by the plus and minus signs thereat, this shift in voltage causes a negative pulse to be transmitted through capacitor C6 to the base of N-P-N transistor Q3 of the multivibrator, turning it off. This causes the collector voltage of transistor Q3 at the junction of resistor R3 and diode D2 to go high whereby a steep wave front high signal is applied to one input of AND logic gate 88. When transistor Q3 turns off, diode D2 blocks any current flow into capacitor C7. Consequently, the output signal from the multivibrator has a sharp rise and is a well defined signal. Capacitor C8 to ground suppresses any noise in the multivibrator output signal.

The operation just described is the first action of the multivibrator comprising transistors Q2 and Q3. This multivibrator is thus started by the pulse demand signal turning switching transistor Q1 on, and will continue to oscillate as long as the pulse demand signal remains. The multivibrator goes through at least two oscillations. The first oscillation generates a preliminary pulse at terminal MC19 and the second oscillation generates an operate pulse at terminal MC20. The operate pulse with its greater delay is used to operate the LSL coil circuits with a delay emulating electromagnetic relay coils as hereinafter described.

After transistor Q3 turned off as aforesaid, capacitor C6 discharges and capacitor C7 charges to the polarity shown thereat, the charging current flowing from the plus 5 volt source through resistor R4, the base-emitter junction of transistor Q2 and the collector-emitter junction of transistor Q1.

The output of the multivibrator is connected to AND logic gates 88 and 90 at the input of a 2-position counter consisting of a shift register having the two outputs of its second flip-flop cross-connected back to the two inputs of its first flip-flop. This counter is shown at the upper right-hand portion of FIG. 7A and the upper left-hand portion of FIG. 7B.

The first position of this counter comprises a flip-flop having the aforementioned AND logic gate 88 and another AND logic gate 90 whose outputs are connected to inputs of OR logics 92 and 94, respectively. The outputs of these two OR logics are cross-connected to their inputs.

The second position of this counter comprises a similar flip-flop having a pair of AND gates 96 and 98 with their outputs connected to inputs of OR logics 100 and 102, respectively. The outputs of these two OR logics are cross-connected to their inputs.

Outputs 104 and 106 of the first flip-flop are connected to inputs of AND logic gates 96 and 98 and through a pair of noise-suppressing capacitors C9 and C10, respectively, to ground. The output of the multivibrator is also connected through an inverter logic 99 to the second inputs of AND logic gates 96 and 98. Outputs 108 and 110 of the second flip-flop are cross-connected to inputs of AND logic gates 88 and 90 at the inputs to the first flip-flop. Outputs 108 and 110 are also connected to inputs of AND buffer output logics 112 and 114, respectively, and through noise-suppressing capacitors C11 and C12, respectively, to ground.

Output 104 which is also the output of the first position of the counter is connected to the other input of logic 114. Output 106 of the first flip-flop is connected to the other input of AND buffer output logic 112. Output 108 is connected to one input of AND logic 85.

The remaining connections from this 2-position counter are for manual (single step) control purposes and will become apparent from description of the latter hereinafter appearing.

Returning now to the operation, it will be recalled that when the multivibrator was started by the pulse demand signal, it applied a high signal to an input of logic gate 88. This high goes also to an input of logic gate 90 and to the input of logic 99.

The counter is initially in its 0,0 state, that is, lows at terminals 104 and 108, and highs at terminals 106 and 110.

The high signal from the multivibrator flips the first flip-flop to its 1 state to provide a high at terminal 104 and a consequent low at terminal 106. The highs from terminals 104 and 110 are applied to logic 114, causing it to provide a low at terminal MC19 about one millisecond after receipt of the pulse demand as shown in FIG. 8. This low is the start of the preliminary pulse.

After one millisecond, the output of the multivibrator goes low. This multivibrator is constructed in known manner whereby transistors Q2 and Q3 are biased through resistors R1 and R5 to conduct simultaneously, but cross-coupled capacitors C6 and C7 prevent this and instead force these transistors to conduct alternately, so long as the pulse demand signal holds transistor Q1 turned on. Transistor Q3 is held turned off so long as the discharge current of capacitor C6 develops sufficient voltage across resistor R5 to do so. The discharge current of capacitor C6 decreases and eventually becomes so small that the voltage across resistor R5 is insufficient to hold the base of transistor Q3 at cutoff and the latter turns on. The consequent drop in transistor Q3 collector voltage is applied through capacitor C7 as a negative pulse to the base of transistor Q2 to turn it off. As a result, the aforesaid low signal is applied from the multivibrator to inverter logic 99, which in turn applies a high signal to an input of logic 96. This causes the second flip-flop to be flipped to its 1 state, affording a high at terminal 108. This high is applied to the other input of logic 85 in FIG. 7A to maintain transistor Q1 turned on, since the first input of logic 85 is receiving a high because the step inhibit signal is off (low) inverted to high in inverter 116. Thus, the pulse demand signal must be present for at least two milliseconds for the operate pulse to be generated. This rejects false signals due to electrical interference that are inherently much shorter in duration. The other output 110 of the second flip-flop goes low which is applied to logic 114. This causes terminal MC19 to go high, thus terminating the preliminary pulse, as shown in FIG. 8. The 2-position counter is now in its 1,1 state with highs at outputs 104 and 108.

After another millisecond, the output of the multivibrator goes high again, upon sufficient discharge of capacitor C7. This high is applied to an input of logic gate 90, the high to its other input coming from output 108. Gate 90 provides a low to flop the first flip-flop to its 0 state, with a low on output 104 and a high on output 106. The counter is now in its 0,1 state. Highs from terminals 108 and 106 are applied to AND buffer output logic 112, affording a low therefrom to operate pulse terminal MC20. This is the start of the operate pulse as shown in FIG. 8.

After another millisecond, the multivibrator goes low and is applied to logic 99 which applies a high to an input of logic 98. A high comes to the other input of logic 98 from output 106. This causes the second flip-flop to be flopped to its 0 state, with a low on output 108 and a high on output 110. This low on output 108 is applied to logic 112 to terminate the operate pulse. This low on output 108 also terminates maintenance of the input signal at a logic 85 so that transistor Q1 is put back under the control of the pulse demand signal which upon terminating will stop the multivibrator When the master control circuit is put into use for coil logic operation in a system such as that shown in FIG. 27A-E, the trailing edge of the operate pulse will operate the coil logics which thereupon terminate their pulse demand signals as shown in FIG. 5A, for example. This causes the base of transistor Q1 to go low to stop the multivibrator.

It will be apparent from the foregoing description that once a pulse demand signal is applied and the multivibrator goes through one cycle (its output goes from low to high to low), the maintaining signal sent back to logic 85 will maintain it operating so that it will go through another cycle to assure that an operate pulse is sent out The master control circuit operation in response to a pulse demand signal hereinbefore described is the automatic operation of this circuit. The single-step operation hereinbefore mentioned is an alternative manual operation of this circuit.

SINGLE-STEP OPERATION

The manual operation gets its name "single-step" from the provision of individual manual controls whereby the master control circuit can be operated at will by a step pulse A to provide a preliminary pulse output and then can be operated at will by a step pulse B to provide the operate pulse output.

For this purpose, a single-step control which may for example have three manual switches is connected to terminals MCC2-4 at the left-hand side of FIG. 7A for applying high signals selectively to the three terminals.

These high signals are first brought to logic levels by signal converters. To this end, terminal MCC2 is connected through voltage divider resistors R6 and R7 to ground with the junction between these resistors being connected to the input of inverter logic 116. A noise-suppressing capacitor C13 is connected across resistor R7. In a similar manner, terminal MCC3 is connected through voltage divider resistors R8 and R9 to ground with the junction therebetween connected to an input of AND logic 118, and a noise-suppressing capacitor C14 connected across resistor R9. And in a similar manner, terminal MCC4 is connected through voltage divider resistors R10 and R11 to ground with the junction therebetween connected to an input of AND logic 120, and a noise-suppressing capacitor C15 connected across resistor R11.

A high signal is first applied to terminal MCC2 to inhibit the pulse demand input. Logic 116 inverts this high signal to a low signal that is applied to inputs of logics 84 and 85 to prevent any pulse demand signal from controlling this circuit. This inhibit remains during single-step operation.

Secondly, a high signal step pulse A is applied to terminal MCC3 to cause the circuit to provide a preliminary pulse at terminal MC19. For this purpose, this step pulse A high goes to an input of logic 118. This logic receives highs at its other two inputs from outputs 106 and 110 of the 2-position counter since this counter is in its 0,0 state. As a result, logic 118 applies a low to an input of OR logic 86. This starts the multivibrator in the same manner as hereinbefore described in connection with the pulse demand signal. However, the multivibrator goes through only one cycle, shifting its output from low to high to low to operate the counter and provide a preliminary pulse as shown in FIG. 8. The multivibrator stops at the end of this one cycle because step pulse A has ended and logic 85 is inhibited so that the input is not maintained. The counter is now in its 1,1 state.

Thirdly, a high signal step pulse B is applied to termianl MCC4 to cause the circuit to provide an operate pulse at terminal MC20. For this purpose, this step pulse B goes to an input of logic 102 which receives highs at its other two inputs from outputs 104 and 108 of the counter which is in its 1,1 state as aforesaid. As a result, logic 120 applies to a low to an input of OR logic 86 to run the multivibrator through another cycle. This produces an operate pulse at terminal MC20, leaving the counter in its 0,0 state.

The high signals may be applied at the same time to both terminals MCC3 and MCC4 by pressing a single pushbutton.

UNDERVOLTAGE OPERATION

The undervoltage circuit is shown at the lower central portion of FIG. 7A and its output terminal MC18 is in FIG. 7B. The undervoltage (UV) signal (low) is generated when the logic supply voltage falls from its normal value of 5 volts below approximately 90 percent of full value or 4.5 volts. This UV signal is used to reset all the LSL coil circuits into a proper initial state.

Referring to FIG. 7A, it will be apparent that when the logic supply voltage is at its normal value, current flows through zener diode ZD1 and resistor R12 to ground. The voltage across resistor R12 causes current to flow through current limiting resistor R13 and the gate-emitter junction of transistor Q4 to turn the latter on. This causes current flow through resistor R14 and the collector-emitter junction of transistor Q4 to ground. As a result, a low signal taken from the collector of this transistor is inverted to high by logic 122 and applied to UV output terminal MC18. This is a normal undervoltage "off" signal. This high is also applied to an input of logic 84 to permit automatic operation of the operate pulse circuit only when the undervoltage circuit is off. When the undervoltage signal is on, operation of the master control circuit is inhibited.

When the logic supply voltage falls down to about 4.5 volts, zener diode ZD1 blocks current flow and turns transistor Q4 off, shifting its collector voltage to high. Capacitor C16 to ground suppresses noise in this collector voltage. This high is inverted by logic 122 to low and applied to UV terminal MC18 to indicate that the undervoltage detector is on. This UV signal is applied to all LSL coil circuits to force them into their proper initial state for power-on.

RESTORE OPERATION

The restore circuit is shown at the lower portion of FIG. 7B. The restore signal (low) is generated when the logic supply voltage is turned on and up to about 80 percent of value or about 4.0 volts. This restore signal is used to "restore" the states of "latched" coil circuits.

This restore circuit is similar to the UV circuit just described. Thus, current normally flows through zener diode ZD2 and resistor R15 to ground so that current also flows through resistor R6 to turn transistor Q5 on. The resultant current flow through resistor R17 and the transistor causes a low signal to go to logic 124. Capacitor C17 suppresses noise in the transistor output. Logic 124 inverts this low to high indicating no output at terminal MC17.

This restore circuit is similar to the UV circuit just described except that it operates on rising voltage rather than on falling voltage. Thus, when the logic supply voltage is applied, zener diode ZD2 first blocks current to hold transistor Q5 off. Consequently, a high is applied from the collector to logic 124. The latter inverts it to apply a low on signal to output terminal MC17.

When the logic supply voltage rises to about 80 percent of full value or 4.0 volts, zener diode ZD2 breaks over to allow current flow through resistor R15 to ground so that current also flows through resistor R16 to turn transistor Q5 on. The resultant current flow through resistor R17 and the transistor shifts the voltage an output terminal MC17 to high to terminate the restore signal.

LSL LATCHING COIL CIRCUIT - FIG. 9

The ladder static logic latching coil circuit generates a pulse demand B signal (low) whenever an input signal calls for latching and the circuit is in its unlatched state or whenever an input signal calls for unlatching and the circuit is in its latched state.

Figure 9:
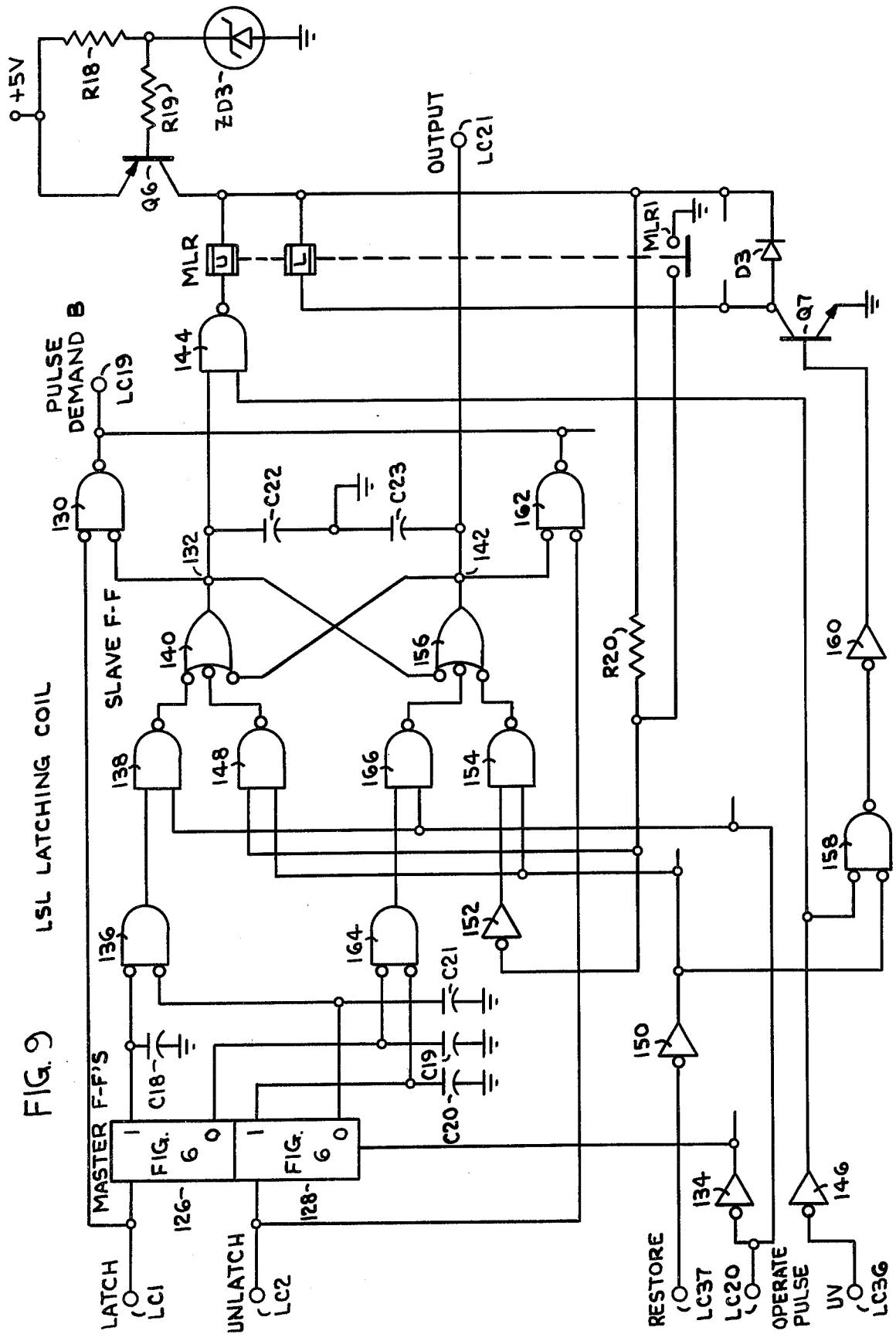
FIG. 9 is a ladder static logic latching coil circuit that includes the logic functional equivalent of one latching coil.

As shown in FIG. 9, this circuit has two master flip-flops 126 and 128 which act as memory elements to the latch and unlatch input signals, respectively, each being like the 1-bit latch circuit shown in FIG. 6. This circuit also has a slave flip-flop hereinafter described. Generally, the master flip-flops are gated during the time of the operate pulse (the input signal being applied to the latch or unlatch input) and the slave flip-flop is gated at the trailing edge of the operate pulse. The output of the slave flip-flop is the output of the circuit.

More specifically, assuming that this circuit is in its unlatched state, output terminal LC21 will be at high. A latch signal (low) applied to input terminal LC1 goes to one input of AND logic 130 which is receiving a low at its other input from output 132 of the slave flip-flop. This causes logic 130 to apply a low pulse demand B signal to terminal LC19.

This pulse demand B when applied to input terminal MC13 will cause the LSL master control circuit to generate a low operate pulse as hereinbefore described in connection with FIGS. 7A-B. This operate pulse is applied to terminal LC20 in FIG. 9 to gate the master and slave flip-flops. To this end, this low operate pulse is inverted to high in logic 134 and applied to both master flip-flops 126 and 128. This gates master flip-flop 126 on so that its 1 output is at low and gates master flip-flop 128 off if it wasn't already off (assuming input terminal LC2 had a high, no input) so that its 1 output is high and its 0 output is low. Capacitors C18-21 to ground suppress noise at the four outputs of the master flip-flops. Two lows now go to the two inputs of AND logic 136 to cause a high to be applied therefrom to one input of logic 138 which is a gate logic of the slave flip-flop.

The slave flip-flop will be gated at the trailing end of the operate pulse. Thus, when terminal LC20 goes high at the end of the operate pulse, this high is applied to the other input of logic 138. The latter applies a low to OR logic 140 of the slave flip-flop causing the latter to be gated so that its output 132 goes high and its output 142 goes low.

This low is applied to output terminal LC21 as the output signal of the circuit.

The high at output 132 of the slave flip-flop is applied to logic 130 to terminate the pulse demand B signal.

Capacitors C22 and C23 to ground suppress noise at the outputs of the slave flip-flop.

UNDERVOLTAGE ACTION

Memory latching relay MLR in FIG. 9 stores the state of the slave flip-flop in the event of an undervoltage condition.

For this purpose, the high at output 132 of the slave flip-flop is applied to one input of AND logic 144. When an undervoltage condition occurs, the master control circuit in FIG. 7A-B sends a low signal to terminal LC36. This low is inverted in logic 146 to apply a high to the other input of logic 144. As a result, the latter applies a low to unlatching coil U of magnetic latched reed relay MLR to energize this coil and reopen contact MLR1. Current normally flows through resistor R18 and zener diode ZD3 to ground. The voltage across resistor R18 causes current flow through the emitter-base circuit and resistor R19 to turn transistor Q6 on. Therefore, when logic 144 switches coil U to ground, current flows through transistor Q6 and coil U to energize this coil. Zener diode ZD3 desensitizes this transistor circuit at about 3 volts so as to turn transistor Q6 off below 3 volts and prevent uncontrolled operation of the logics. If reed relay MLR had been in an unlatched condition, it will be left unlatched. However, this reed relay is normally in a latched condition as will hereinafter appear. As a result of reopening contact MLR1, the signal at the corresponding input of logic 148 will shift from low to high to enable gating of the slave flip-flop with the restore signal when the power comes back on. This high signal comes from the logic supply through transistor Q6 and current limiting resistor R20 to an input of logic 148.

RESTORE ACTION

When the logic supply voltage comes back on, a low signal will be applied from the LSL master control circuit in FIG. 7A-B to restore terminal LC37. Logic 150 inverts it to a high that is applied to the other input of logic 148. The latter applies a low to logic 140 to set the slave flip-flop back to its "latched" state in the event it shifted therefrom during the undervoltage condition.

On the other hand, if reed relay MLR had been in its latched condition when the power went off, this state of the circuit will be saved. This latched condition of the reed relay, of course, corresponds to an off state of the slave flip-flop with a low on output 132 and a high on output 142.

Under this condition, contact MLR1 will be closed, applying a low to logic 152, which in turn applies a high to one input of AND logic 154. When the restore signal comes, logic 150 inverts it to apply a high to the other input of logic 154. As a result, the latter applies a low to an input of OR logic 156 to reset the slave flip-flop to its off state.

LATCH ACTION OF REED RELAY

As was stated previously, the reed relay is normally in its latched condition and is unlatched to save the on state of the slave flip-flop. This reed relay is reset to its latched state by both restore and undervoltage signals being off.

Thus, highs on terminals LC36 and LC37 are inverted by logics 146 and 150 to lows and applied to the two inputs of AND logic 158. This causes logic 158 to provide a low that is inverted by logic 160 to a high. This high is applied to the base of transistor Q7 to turn it on. As a result, current flows through transistor Q6 and latching coil L of reed relay MLR to set the relay in its latched condition wherein its contact is closed. Diode D3 across latching coil L dissipates the induced voltage when transistor Q7 turns off.

UNLATCHING OPERATION OF THE LOGIC CIRCUIT

The unlatching operation is similar to the latching operation except that master flip-flop 128 is used and the slave flip-flop is set to its off state.

Thus, a low at unlatch input terminal LC2 is applied to AND logic 162 along with a low from output 142 of the slave flip-flop in its on state. Logic 162 then sends out a pulse demand B signal eliciting an operate pulse into terminal LC20. This operate pulse first sets master flip-flop 128 to on state and master flip-flop 126 to off state, resulting in two lows to AND logic 164. The latter sends a high to one input and AND logic 166. The operate pulse trailing end then applies another high to logic 166 causing it to set the slave flip-flop into its off state.

LSL TIMER COIL CIRCUIT - FIG. 10

The ladder static logic timer coil circuit operates in response to an input signal at terminal TC1 to provide an instantaneous output signal at terminal TC21 and a delay output signal at terminal TC22 a time interval after the instantaneous output signal. With a small modification, this timer coil circuit can be modified from an E-timer to a D-Timer. That is, this circuit normally operates as an E-Timer, meaning delay after energization. By connecting a jumper between terminals TC3 and TC23 as indicated by the broken line, this circuit is converted to a D-Timer, meaning delay after deenergization.

The portion of this circuit generating the instantaneous output signal is almost like the LSL control coil circuit in FIG. 5, except that an AND logic is added between the two flip-flops to afford resetting of the second flip-flop directly when power is initially applied as hereinafter described, and that the instantaneous output is taken from the 1 bit output of the second flip-flop rather than the 0 bit output.

INITIAL RESET TO OFF

When logic power is first applied, the LSL timer coil circuit is reset to its off state, equivalent to a deenergized condition of a timer relay. This is done with the undervoltage signal that is generated by the LSL master control circuit of FIG. 7A -B. This undervoltage signal which is a low is applied to terminal TC39 in FIG. 10 and from there to inputs of OR logics 168 and 170. As a result, logic 168 applies a high signal to an input of AND logic 172 and to the operate input of first flip-flop 174 whereas logic 170 applies a high signal to the operate input of second flip-flop 176. This causes logic 172 to apply a high signal to the logic input of second flip-flop 176, enabling the operate signal to set it in its 0 state with a high at its 1 bit output.

This high is applied directly to instantaneous output terminal TC21 to be indicative of its off state.

The manner in which the delay output is reset into its off state depends on whether this circuit is being used as an E-Timer or D-Timer.

If it is an E-Timer with the jumper left off terminals TC3 and TC23, the high is applied from the 1 bit output of flip-flop 176 to one input of exclusive OR logic 178 which will function presently as a coincidence logic. A high is applied from terminal TC3 to the other input of logic 178 and also to one input of exclusive OR logic 180. As a result, logic 178 applies a low to OR logic 182 of the timing flip-flop, causing its output to go high which is applied through the cross-connection to an input of OR logic 184 of the timing flip-flop. The other input of logic 184 being at a high, its output shifts to low and is applied to one input of exclusive OR logic 180. Since exclusive OR logic 180 now has high and low inputs, its output goes high.

This high is applied to delay output terminal TC22 to be indicative of its off state.

The E-Timer has now been reset to its off state in response to initial application of logic power.

If the circuit is a D-Timer with the jumper connecting terminals TC3 and TC23, flip-flop 176 is reset as hereinbefore described and the high is applied from the 1 bit output thereof to one input of exclusive OR logic 178, the other input of the latter receiving a low from terminal TC3. As a result, logic 178 operates as an exclusive OR and applies a high to one input of logic 182. A low is applied from terminal TC3 to one input of AND logic 186 and one input of exclusive OR logic 180. Logic 186 receives a low to its other input from the undervoltage (UV) input terminal TC39. Consequently, logic 186 applies a high to an input of OR logic 188 causing it to apply a low to an input of logic 184 of the timing flip-flop. This causes the output of logic 184 to go high which is applied to an input of exclusive OR logic 180. A low is applied to the other input of logic 180 from terminal TC3 as aforesaid whereby it applies a high to delay output terminal TC22.

This high at terminal TC22 is indicative of its off state.

E-TIMER OPERATION

The operation of the LSL timer coil circuit of FIG. 10 with delay after energization will now be described with reference to the curves shown in FIG. 10A. For this operation, the jumper is left off from terminals TC3 and TC23 so that terminal TC3 is at a high signal.

A low input at terminal TC1 causes generation of a pulse demand C signal at terminal TC19 as shown in FIG. 10A. For this purpose, this low is applied to one input of exclusive OR logic 190. The exclusive OR logics in this circuit are similar to and function in a similar manner to exclusive OR logic 74 described in connection with FIG. 5. The other input of logic 190 receives a low from the 0 bit output of second flip-flop 176 in its off state as aforedescribed. As a result, logic 190 operates as a coincidence circuit and applies a low signal to terminal TC19. This low is sent to the pulse demand C input of the LSL master control circuit sends back a suitably delayed operate pulse (third curve in FIG. 10A) to terminal TC20.

This operate pulse is applied from terminal TC20 in FIG. 10 to an input of logic 168 which applies a high to first flip-flop 174 to set the latter into its on state with a low at its 1 bit output. Capacitors C24 and C25 to ground suppress noise at the outputs of the first flip-flop. This low is applied to one input of logic 172. At the end of the operate pulse, the output of logic 168 shifts to low and is applied to the other input of logic 172, and the output of logic 170 shifts to high. Logic 172, now having two low inputs, provides a low to the logic input of second flip-flop 176 allowing the high at its operate input to set it in its on state, providing a low at its 1 bit output.

This low is applied to terminal TC21 as an instantaneous output signal as shown by the fourth curve in FIG. 10A.

Capacitors C26 and C27 to ground suppress noise at the second flip-flop outputs.

To obtain the delay output signal, the low from the second flip-flop is also applied to one input of logic 178 which receives a high at its other input from terminal TC3, the latter going also to one input of logic 180. As a result, logic 178 operates as an exclusive OR and applies a high to one input of AND logic 192 which receives a high to its other input from logic 182 of the timing flip-flop in its off state as aforedescribed. This causes logic 192 to apply a low through resistor R21 to turn shunt transistor Q7 off to allow timing capacitor C28 to start charging.

The charging time of capacitor C28 affords the time delay for the LSL timer coil circuit. For this purpose, current flows from terminal TCC1 through resistor R22 to charge the timing capacitor. As shown by a broken line, timer coil cable terminal TCC1 is connected through an external timing potentiometer 194 to a plus D.C. source. This potentiometer is an adjustable resistor which determines the time constant of the RC circuit in conjunction with fixed value resistor R22.

A programmable unijunction transistor PUT detects the end of the time interval. For this purpose, a voltage divider comprising series resistors R23 and R24 and a capacitor C29 across the latter is supplied with positive voltage from timer coil cable terminal TCC14. A predetermined voltage is applied from the junction between these resistors to gate G of the PUT. Thus, when capacitor C28, which is connected to anode A of the PUT, reaches a voltage at or slightly above that predetermined voltage, the PUT suddenly conducts current through resistors R25 and R26 to ground to discharge the timing capacitor. As a result, a high is applied from the junction of resistors R25 and R26 to an input of OR logic 188. This causes a low to go from the output of logic 188 to an input of logic 184 of the timing flip-flop causing the latter to be set to its on state wherein logic 184 applies a high to an input of exclusive OR logic 180. Capacitor C29 suppresses noise that may come in from terminal TCC1. Capacitors C30 and C31 to ground suppress noise at the outputs of the timing flip-flop.

Logic 180 functions as a coincidence logic. Thus, since it receives a high to its other input also from terminal TC3, it applies a low to terminal TC22 as a delay output signal as shown by the lowermost curve in FIG. 10A.

The high from the output of logic 184 is applied through the cross-connection to logic 182 causing its output to go low. This low is fed back to an input of logic 192 to switch its output high. This turns on transistor Q7 to discharge timing capacitor C28 fully so that the timing cycles will have a uniform length.

D-TIMER OPERATION

For this operation, the jumper is connected across terminals TC3 and TC23 to apply a low signal to one input of logic 178.

Initially, instantaneous output terminal TC21 and delay output terminal TC22 have low signals since the circuit is on. To start the delay after deenergization, input terminal TC1 is switched from low to high as shown in FIG. 10B. Two high inputs cause logic 190 to send out a pulse demand C signal shown by the second curve in FIG. 10B from terminal TC19 to the LSL master control circuit whereafter an operate pulse shown by the third curve in FIG. 10B is received at terminal TC20. This operate pulse sets flip-flop 174 to off state, applying a high to logic 172. At the end of the operate pulse, flip-flop 176 is set to off state, providing a high to one input of logic 178, and a high to terminal TC21 to terminate the instantaneous output as shown by the fourth curve in FIG. 10B.

With low and high inputs, logic 178 applies a high to logic 192 which receives another high from logic 182 of the timing flip-flop. Consequently, logic 192 applies a low through resistor R21 to turn transistor Q7 off.

This starts the timing circuit in the same manner as before whereafter a high is applied to logic 188. This logic applies a low to logic 184 setting the timing flip-flop to its on state. As a result, the latter switches the second input of logic 180 from low to high causing its output to be shifted from low to high. This high at terminal TC22 represents the delayed deenergization of the circuit as shown by the lowermost curve in FIG. 10B.

LSL SWITCH CONTACTS - FIG. 11

Figure 11:
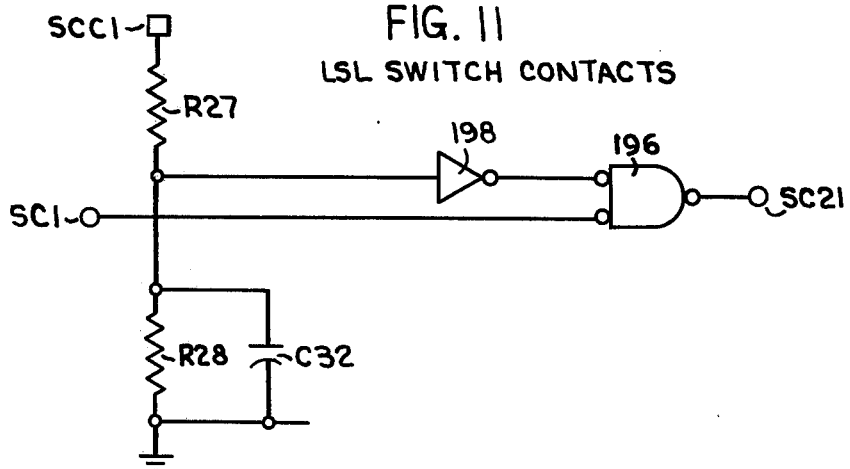
FIG. 11 is a ladder static logic switch contacts circuit that includes the logic functional equivalent of one switch contact and its operating means.

FIG. 11 shows the ladder static logic switch contacts circuit. This circuit differs from the normally-open and normally-closed contacts circuits in that it requires voltage conversion since the switches such as the pushbutton switches and limit switches operate at higher power such as 24 volts D.C., that is, higher than 5 volt logic power.

The switch contact circuit extends from input terminal SC1 through AND logic 196 to output terminal SC21. This switch contact circuit may be either normally-open or normally-closed depending upon the control signal applied to switch contact cable terminal SCC1. As will be apparent, this control signal emulates the mechanical pushbutton or limit switch operator, or the like.

For a normally-closed switch contact, a high voltage is applied to terminal SCC1, such as 24 volts D.C., from the closing of an external pushbutton or limit switch. This causes current flow through voltage divider resistors R27 and R28 to ground. Capacitor C32 connected from the junction of these resistors to ground suppresses noise. A logic level high signal is applied from the junction of these resistors to inverter logic 198. The latter inverts this high to a low and applies it to gate logic 196 so that a low signal will pass from the input terminal to the output terminal. Thus, the circuit will emulate a normally-closed switch contact as long as the voltage is maintained on terminal SCC1. To open this normally-closed switch contact logic, the high voltage is removed from terminal SCC1 whereafter an input signal at terminal SC1 will no longer pass through.

For a normally-open switch contact, the aforementioned high voltage is left off terminal SCC1. To close this normally-open switch contact, this high voltage must be applied to terminal SCC1.

These contact logics may be connected in series, exactly as relay contacts are interconnected, and any number may be wired in series. Either the inputs or outputs of these contact logics may also be wired in parallel to give the equivalent switching action given by relay contacts wired in parallel.

LSL OUTPUT DRIVER - FIG. 12

Figure 12:
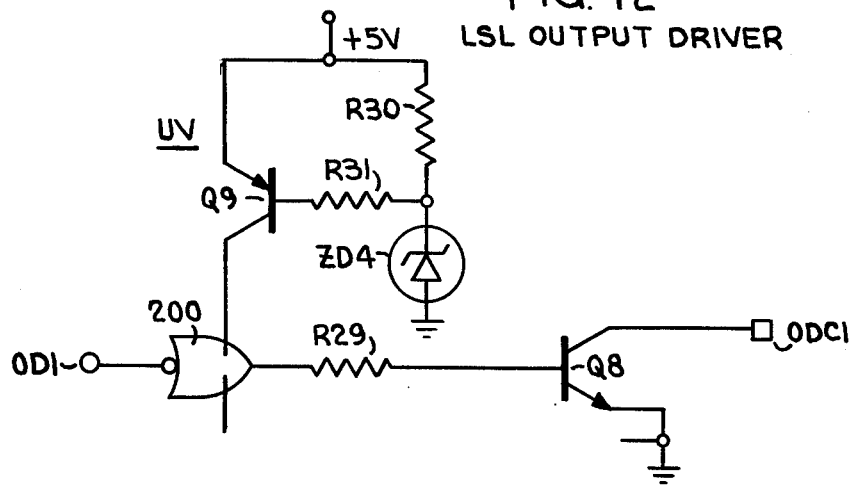
FIG. 12 is a ladder static logic output driver circuit that is used to amplify the logic level output signal to a higher level required for operating a load device.

FIG. 12 shows the ladder static logic output driver circuit. The purpose of this output driver circuit is to raise the logic level signal to a higher level such as plus 24 volts D.C. capable of operating a load device.

This circuit comprises an input terminal OD1 to which a low signal is applied. This low signal goes to the input of an OR logic 200 which in turn applies a high signal through resistor R29 to the base of an N-P-N transistor Q8 to turn it on. An OR logic 200 is used herein because in normal use it has a second, alternative input for test purposes, this being omitted herein to avoid complicating the drawing. Upon being turned on, transistor Q8 connects output driver cable terminal ODC1 to ground and thus provides a "sink" output for energizing a load device connected from this terminal to a positive D.C. source of 24 volts.

An undervoltage detector circuit UV is included in the supply voltage circuit for logic 200. Normally current flows from the plus 5 volts source through resistor R30 and zener diode ZD4 to ground. The voltage drop across resistor R30 causes current flow through the emitter-base junction of transistor Q9 and resistor R31 to bias the transistor on. As a result, this transistor allows current flow through its emitter-collector junction to supply logic 200. If the logic supply voltage should drop a predetermined amount such as below 80 percent of full value, zener diode ZD4 blocks current flow thereby to turn transistor Q9 off. This cuts off the supply voltage from logic 200 to prevent erratic operation thereof such as false turn-on of outputs under abnormal undervoltage conditions.

DETERMINING THE SYSTEM CONFIGURATION

The next step in making the LSL system, after the LSL schematic diagram of FIGS. 2A-C has been prepared, is to determine the system configuration. This involves a determination of the number of LSL boards of each type that are required, the number of LSL buckets required, and the capacity for power supplies required.

These LSL boards are printed circuit (PC) boards and each has mounted thereon one or more like logic circuits as follows:

| Board Type | Circuits Per Board |
|---|---|
| Master Control | 1 |
| Switch Contacts | 12 |
| N.O. Contacts | 16 |
| N.C. Contacts | 16 |
| Control Coil | 12 |
| Latching Coil | 4 |
| Timer Coil (3's or 30's) | 4 |
| Output Driver (24V or 110V) | 12 |

While one timer coil board has been listed above, it will be apparent that there may actually be timer coil boards having different time delay ranges such as 0.03 to 3 seconds and 0.03 to 30 seconds or the like adjusted from an external potentiometer 194 in FIG. 10.

Also, while one output driver has been listed above, more than one may actually be used in a system as, for example, in the system of FIGS. 27A-E where they supply 24 volt and 115 volt loads.

LSL BOARDS

Each of these LSL boards consists of a 5 × 7 inch PC board on which are mounted the integrated circuit (IC) static logic elements forming the logic circuits. The rear edge of the board has 44 contacts, 22 on each side of this rear edge, whereby the board is plugged into one of 26 slots in a logic bucket. Some of these boards that require it also have a 14-pin cable receptacle on one side on the front end portion. This cable receptacle receives a cable plug for making connections such as control, output and alternative input signal connections as hereinafter described in connection with boards in slots A1, A2, A7, A8 and A9 in FIGS. 27A-E.

LSL BUCKET

The LSL bucket has 26 slots for receiving the logic boards and each slot has a receptacle (connector socket) into which the board is plugged. These receptacles have terminal pins at the rear, one for each board contact, for a total of 44 terminal pins, that are used for interwiring the boards as hereinafter described. The top and bottom pairs of terminals pins are used to supply logic power to the boards, the positive side of plus 5 volts being connected to the top pair of terminal pins and the negative side or D.C. common being connected to the bottom pair, leaving 40 terminal pins for signal inputs and outputs, numbered 1-20 and 21-40 in two columns.

The slots in a bucket are numbered from 1 to 26 from left to right and the buckets are numbered A, B, C, etc.

THE PANELBOARDS

Figure 27E:
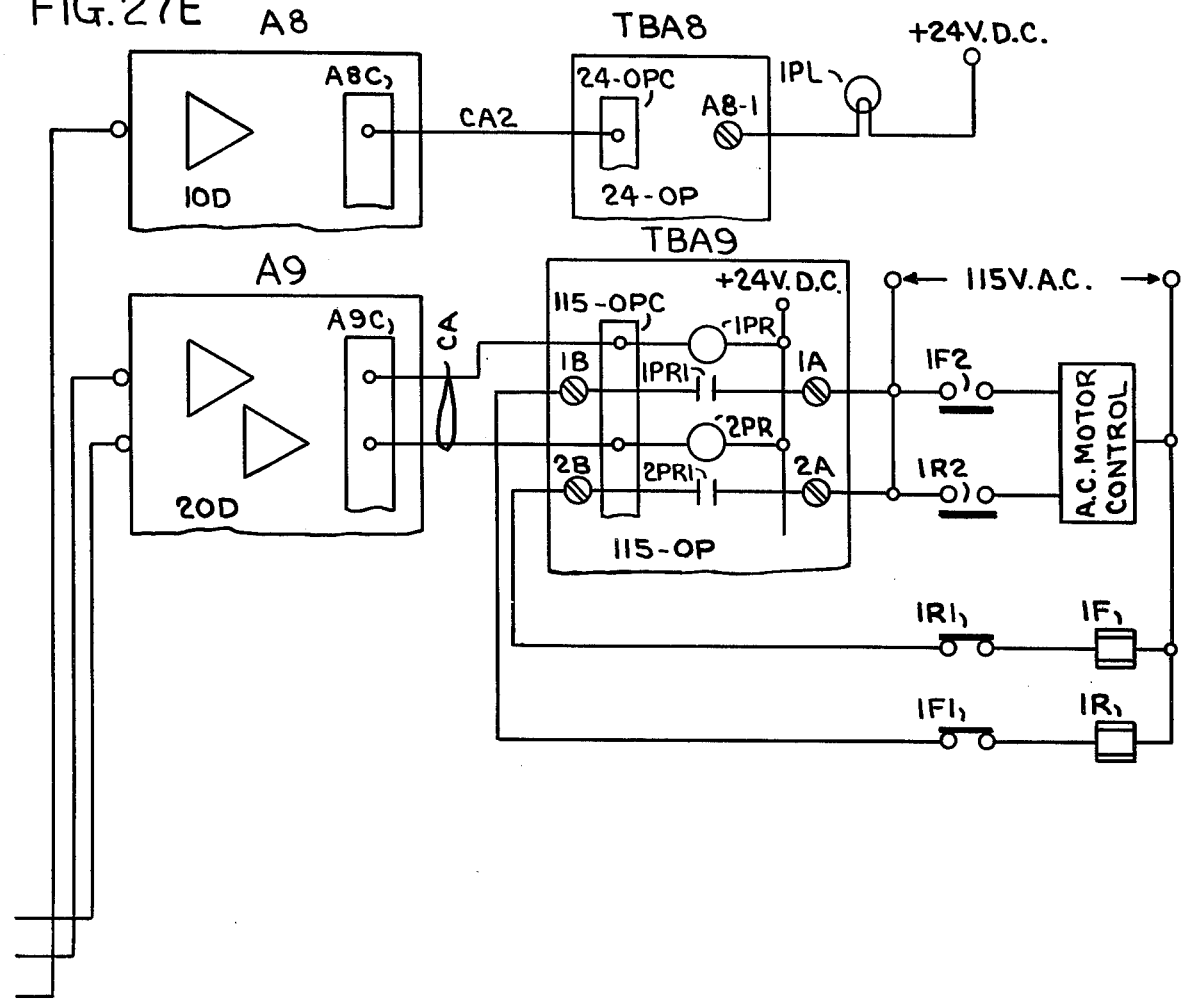

These are boards mounted on the control cabinet panel and are for the purpose of interfacing the logic and control signals to controlling and controlled devices. Pushbuttons, limit switches, etc., are examples of controlling devices, and solenoids, lamps, reed relays, etc. are examples of controlled devices. These panelboards have twelve pressure, screw terminals for field wiring connections and a twelve terminal cable receptacle for output signals. The 24 volt D.C. input (and output) panelboard has direct connections between the screw terminals and the cable terminals. The 115 volt A.C. input panelboard additionally has signal converters for changing the twelve 115 volt A.C. signals to 24 volt D.C. signals. The 115 volt A.C. output panelboard additionally has signal converters as shown in FIG. 27E for changing the 24 volt D.C. signals to 115 volt A.C. signals.

All control signals between the logic bucket and input or output panelboards are at 24 volts D.C.

SELECTING THE BOARDS

The number of PC boards required can now be determined with the aid of the above listing of the number of circuits per board and the logic schematic diagram shown in FIGS. 2A-C.

These materials indicate that the system of FIG. 27A-E will require one master control board MC, one switch contacts board SC, one N.O. contacts board NO, one N.C. contacts board NC, one control coil board CC, one latching coil board LC, one timer coil board TC, and two output driver boards 10D and 20D. The first output driver board 10D is for the 24V D.C. lamp load and the second output driver board 20D is for the 115V A.C. motor contactors load. Although each output driver board has a twelve driver capacity, separate driver boards must be used because the output cables going therefrom to the different types of output panel boards cannot be divided.

In addition to the PC boards, there is required one 24V D.C. input panelboard IP as shown in FIG. 27A, one 24V D.C. output panelboard 24-OP and one 115 volt output panelboard 115-OP as shown in FIGS. 27A and 27E.

Only one bucket is required for the nine PC boards shown in FIGS. 27A-E and it is identified as bucket A.

LSL CONNECTION CHARTS AND LISTS

A systematic and efficient method of determining and making the connections of an LSL control system will now be described. This method is performed with the aid of the LSL connection charts shown in FIGS. 13-21 and the wiring lists shown in FIGS. 22-26. This method begins with the LSL ladder diagram shown in FIGS. 2A-C, after it has been prepared from the standard relay ladder diagram shown in FIG. 1 as hereinbefore described, and ends with the connection lists or the actual connections made as indicated thereon, as hereinafter described.

The LSL connection chart and wiring list method comprises generally the following steps:

Step 1: Assign LSL components to the connection charts, including the following:
    A. Control relay coils
    B. Latching relay coils
    C. Timer relay coils
    D. N.O. contacts
    E. N.C. contacts
    F. Switch contacts
    G. Output drivers Step 2: Assign logic wire numbers to the LSL components on the connection charts including:
    A. Logic common number B. LSL wire number standards:
   0001–4999 Ladder diagram wire numbers
   5000–5999 Control coil outputs
   6000–6999 Timer coil instantaneous outputs
   7000–7999 Timer coil delayed outputs
   8000–8999 Latching coil outputs
   9000–9009 Master control connections
   9010–9699 Monitor connections (not shown)
   9700–9799 Repeater connections
   9800–9899 Timer D-jumpers
   9900–9999 Miscellaneous Step 3: Assign boards to bucket slots by entering the bucket letter and slot numbers A1–A9 on the connection charts.

Step 4: Prepare wiring lists shown in FIGS. 22–26.

Step 5: Make the logic connections.

Each of these steps of the method of making the connections of the LSL control system will now be described in detail with reference to FIGS. 13–27 of the drawings.

STEP 1

In connection with Step 1A, the control relay coils of the LSL ladder diagram in FIG. 2A are assigned by entering 1CR, 3CR and 4CR in the Device column in FIG. 16, and entering the line number 1, 9, 10 from the ladder diagram on which each control coil is located in the Line No. column in FIG. 16.

This connection chart in FIG. 16 is designated LSL Control Coil Board and has space for twelve control coils although only four are shown in FIG. 16 as sufficient to illustrate the invention. The left-hand (input) sides of these coils are numbered 1–12 and the right-hand (output) sides thereof are numbered 21–32, these numbers also corresponding to the terminal numbers at the rear of the logic bucket for this board. Pins 19, 20 and 39 are assigned to pulse demand A, operate pulse and undervoltage signals, respectively, beforehand. The remaining pins are used for monitor, not shown herein.

Figure 17:
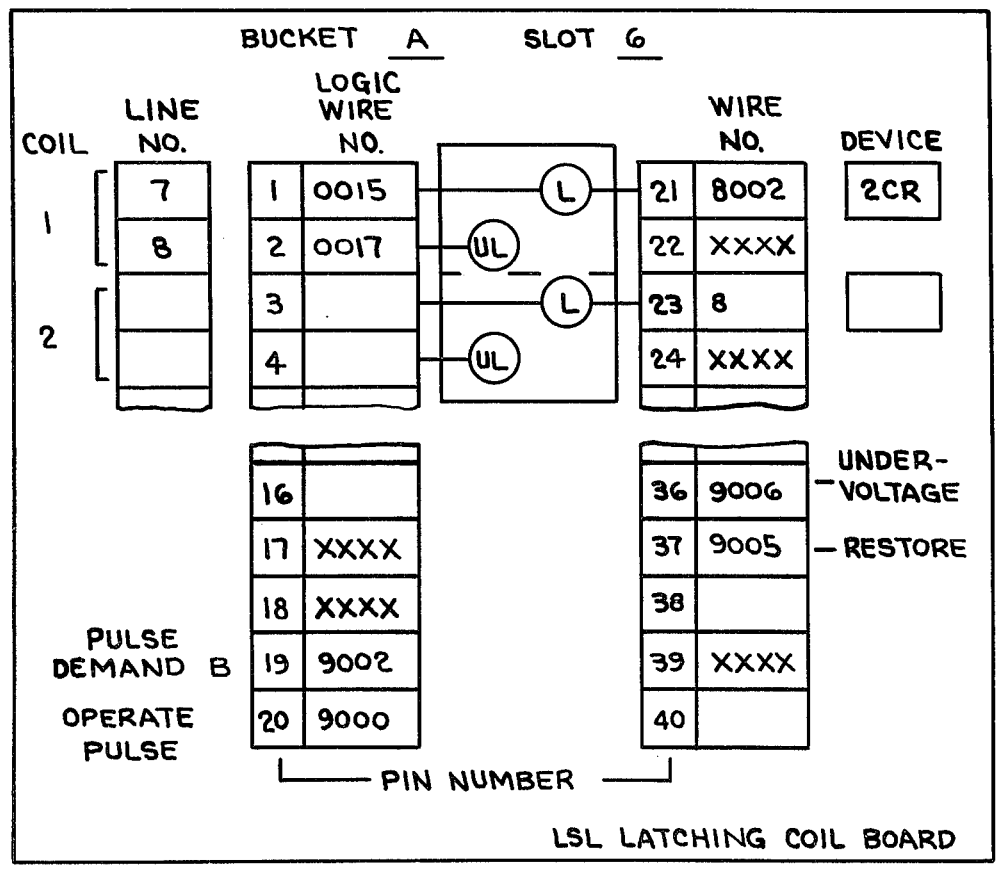

Next, in accordance with Step 1B, the latching relay coil is assigned by entering 2CR in the Device column and entering 7 and 8 in the Line No. column opposite the latch L and unlatch UL coil symbols in FIG. 17.

This connection chart in FIG. 17 is designated LSL Latching Coil Board and has space for four latching coil pairs, each pair including a latch and unlatch coil, although only two coil pairs are shown in FIG. 17 as sufficient to illustrate the invention. The left-hand (input) sides of these coils are numbered 1–8 and the right-hand (output) sides thereof are numbered 21, 23, 25, 27, these numbers corresponding to the terminal pin numbers at the rear of the logic bucket. Terminal pins 19, 20, 36 and 37 have been preassigned to pulse demand B, operate pulse, undervoltage and restore input signals, respectively. The remaining pins are used for monitor, not shown, or are unused and marked XXXX.

Figure 18:
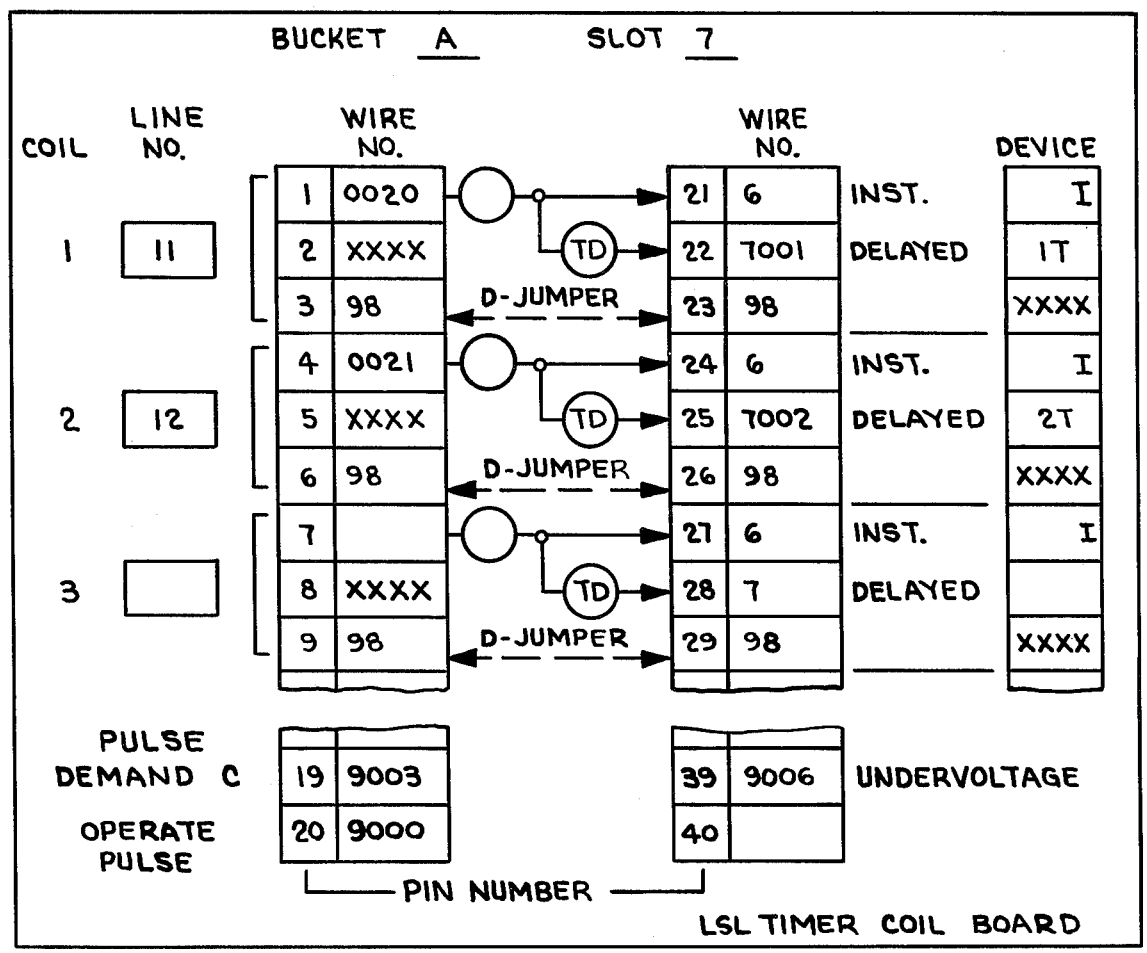

Next, in accordance with Step 1C, the timer relay coils are assigned by entering 1T and 2T from the ladder diagram into the Device column opposite the "delayed" outputs of the timer coils in FIG. 18. If the timer coils were to have instantaneous outputs, 1T and 2T would also be entered in the Device column preceeding the I opposite the instantaneous outputs; however, instantaneous outputs are not used herein. Also, line numbers 11 and 12 are entered in the Line No. column to indicate the lines on which the timer coils are located in the ladder diagram in FIG. 2B.

This connection chart in FIG. 18 is designated LSL Timer Coil Board and has space for four timer coil pairs each pair including an instantaneous output signal coil and a delayed output signal coil, although only three coil pairs are shown in FIG. 18 as sufficient to illustrate the invention. The left-hand input sides of these coil pairs are numbered 1, 4, 7 and 10 and the right-hand output sides thereof are numbered 21,22; 24,25; 27,28 and 30,31. The jumpers whereby the timers are changed from E-Timers to D-Timers are numbered 3,23; 6,26; 9,29 and 12,32. These numbers correspond to the terminal pins at the rear of the logic bucket for this board. Terminal pins 19, 20 and 39 have been preassigned to pulse demand C, operate pulse and undervoltage input signals, respectively. The remaining terminal pins are used for monitor, not shown, or are unused and marked XXXX.

Next, in accordance with Step 1D, the N.O. contacts are assigned by entering the controlling devices 1CR, 2CR, 3CR, 4CR, 1T and 2T in the Device column from the ladder diagram of FIG. 2A opposite successive pairs of contacts in FIG. 14. The assignment involves pairs of contacts, 1CR being entered twice since it has four contacts. The line numbers 2, 3, 4, 7, 5, 12, 11, 8 and 7 of the contact locations on the ladder diagram are entered in the Line No. column, an X being entered in the unused space when a coil has an odd number of N.O. contacts.

This connection chart in FIG. 14 is designated LSL N.O. Contact Board and has space for 16 contacts in 8 pairs thereof. The left-hand input sides of these contacts are numbered 1–16 and the right-hand output sides thereof are numbered 21–36, these numbers corresponding to the terminal pins at the rear of the logic bucket. Terminal pin numbers 17–20 and 37–40 are reserved for the contact controlling devices, that is, the 8 coils that control the eight pairs of contacts as hereinafter described. These control terminals 17–20 and 37–40 are also preassigned in the Terminal column at the right-hand side.

Next, in accordance with Step 1E, the N.C. contacts are assigned by entering the controlling coils 2CR, 3CR and 4CR in the Device column opposite each pair of contacts in FIG. 15. This assignment involves pairs of contacts. The line numbers 6, 6, 8, 5, 7 of the contact locations on the ladder diagram are entered in the Line No. column, an X being entered in the unused space when a coil has an odd number of N.C. contacts.

This connection chart in FIG. 15 is designated LSL N.C. Contact Board and has space for 16 contacts in 8 pairs thereof, only 4 pairs being shown as sufficient to illustrate the invention. The left-hand input sides of these contacts are numbered 1–16 and the right-hand output sides thereof are numbered 21–36, these numbers corresponding to the terminal pins at the rear of the logic bucket. Terminal pin numbers 17–20 and 37–40 are reserved for the contact controlling devices, that is, the coils that control the pairs of contacts as hereinafter described. These control terminal pin numbers are also preassigned in the terminal column at the right-hand side as shown in FIG. 15.

Figure 19:
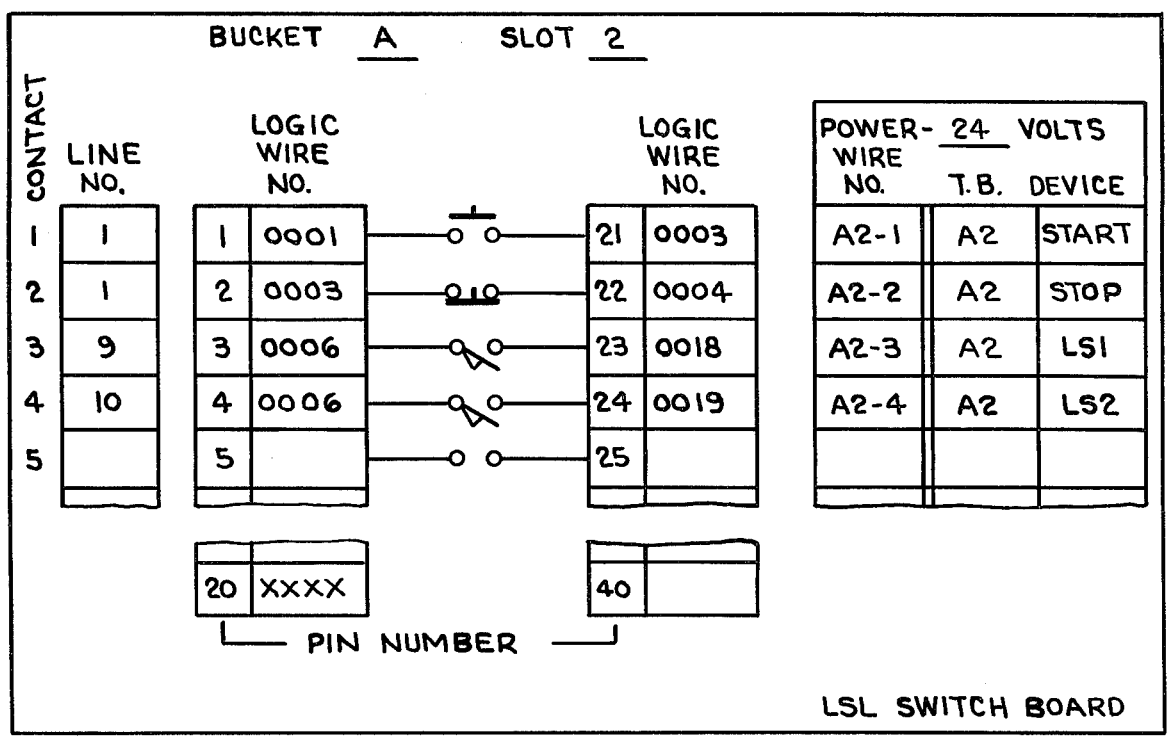

Next, in accordance with Step 1F, the switch contacts are assigned by entering the device symbols between the terminals in FIG. 19, such as the start switch symbol, the stop switch symbol, and the two limit switch symbols, and entering the line numbers 1, 1, 9, 10 thereof in the Line No. column at the left-hand side. In addition, the designations START, STOP, LS1 and LS2 are entered in the Device column opposite their symbols.

This connection chart in FIG. 19 is designated LSL Switch Board and has space for 12 switch contacts, only five being shown as sufficient to illustrate the invention. The left-hand input sides of these contacts are numbered 1-12 and the right-hand output sides thereof are numbered 21-32, these numbers corresponding to the terminal pins at the rear of the logic bucket. The remaining terminal pin numbers 13-20 and 33-40 are used for monitor purposes not shown or are unused and marked XXXX.

Figure 21:
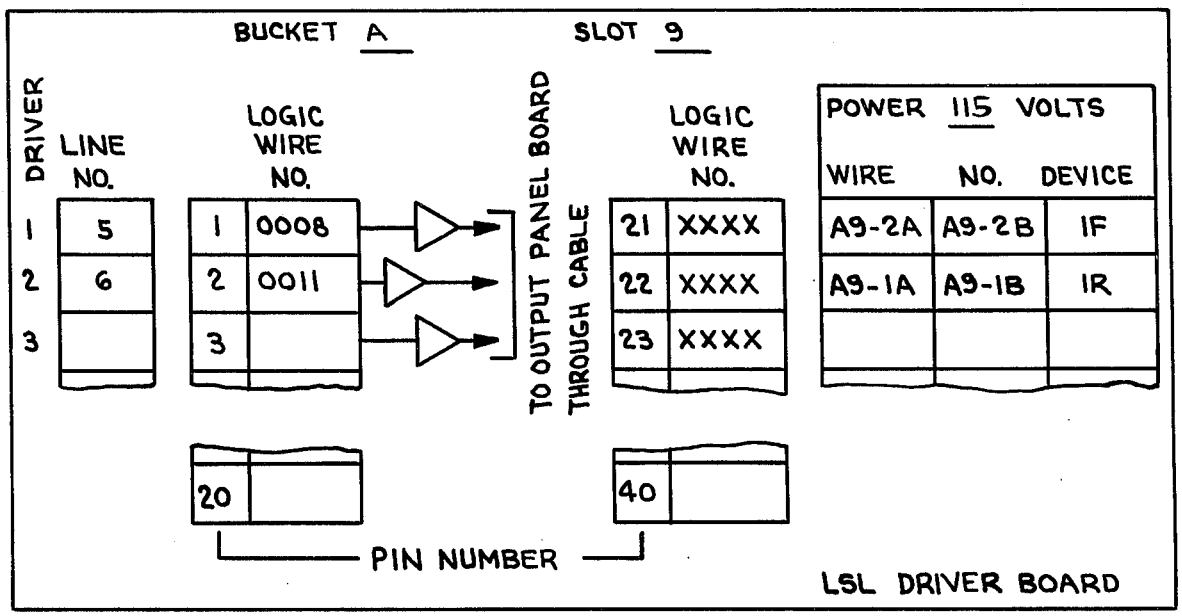
Figure 20:
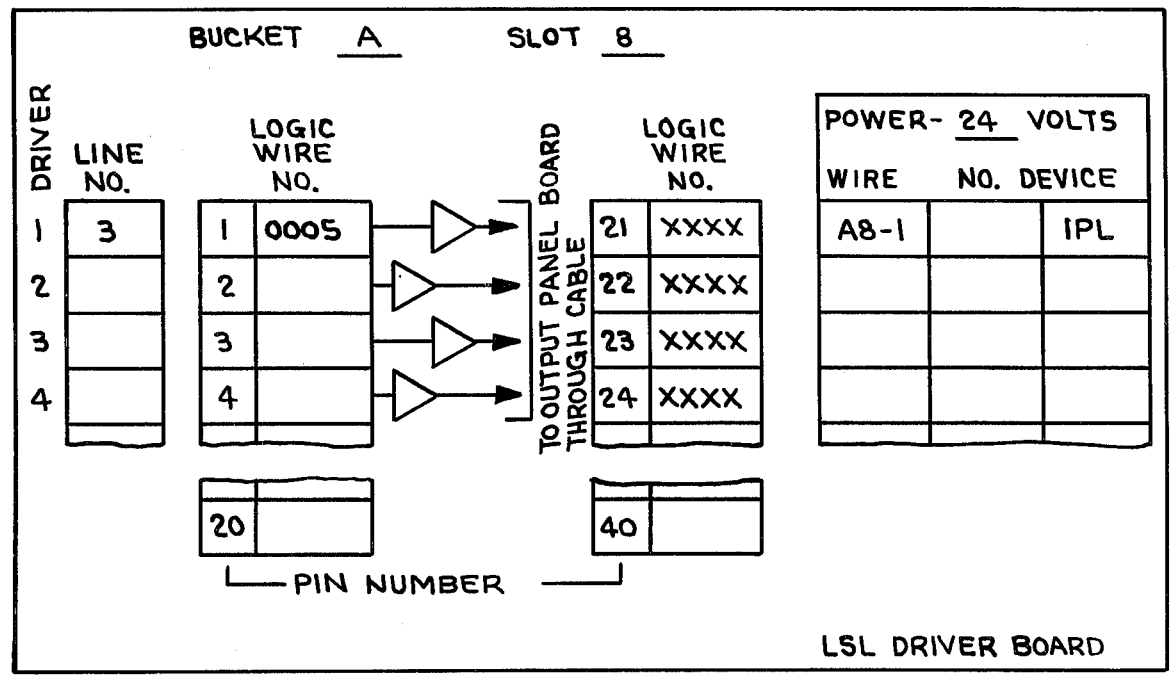

Next, in accordance with above Step 1G, the output drivers are assigned by entering the line numbers and designations of the output devices on the connection charts in FIGS. 20 and 21. Two connection charts are used for the two output driver boards 10D and 20D, respectively. Separate output driver boards are used for the 24V D.C. and 115V A.C. output devices because the cables going from the output driver boards to the 24 volt and 115 volt output panel boards cannot be divided. Thus, line 3 and lamp designation 1PL are entered in FIG. 20. Similarly, lines 5 and 6 and contactor designations 1F and 1R are entered in FIG. 21.

Each of these connection charts in FIGS. 20 and 21 is designated LSL Driver Board and has space for 12 drivers, only a few being shown as sufficient to illustrate the invention. The left-hand inputs of these drivers are numbered 1-12 and the right-hand outputs thereof are numbered 21-32, these numbers corresponding to the terminal pins at the rear of the logic bucket. The remaining terminal pin numbers are for other purposes, not shown or are unused.

STEP 2

In connection with this second step of the method of making the LSL control system, the logic wire numbers are assigned to the LSL components on the connection charts shown in FIGS. 13-21.

MASTER CONTROL WIRE NUMBERS

First a logic common number must be assigned. This may be the left line logic input number of the ladder diagram of FIGS. 2A-B. Thus, the logic common number 0001 is entered opposite terminal 40 of the connection chart in FIG. 13.

This connection chart in FIG. 13 is designated LSL Master Control Board and has space for certain inputs and outputs. Wire numbers 9001, 9002, 9003 and 9004 have been preassigned to terminal pins 12, 13, 14 and 15 designated Pulse Demand A, B, C and D, respectively. These wire numbers identify the pulse demand input signals to the master control board.

Wire numbers 9005, 9006 and 9000 have been preassigned to terminal pins 17, 18 and 20 designated Restore, Undervoltage and Operate Pulse, respectively. The remaining terminal pins are unused and marked XXXX.

As will be apparent, these wire numbers have been preassigned from the above standards list.

CONTROL COIL WIRE NUMBERS

In FIG. 16, the inputs to the control coil logic circuits are given wire numbers 0004, 0018 and 0019 from the ladder diagram in FIG. 2A. The outputs of these control coil logic circuits are given wire numbers 5001, 5003 and 5004 from the series 5000-5999 according to the above standards list. While any number from this series may be assigned, it is preferable to make the last digit the same as the first digit in the device designation, for example 5003 for 3CR. At the same time, these wire numbers are entered at the outputs of the control coils in the ladder diagram of FIG. 2A for future reference.

TIMER COIL WIRE NUMBERS

The timer coil wire numbers are assigned as shown in FIG. 18. The wire numbers 0020 and 0021 for the inputs to the coils are taken from the ladder diagram in FIG. 2A. The line numbers 11 and 12 on the connection chart assist in locating these input wire numbers. Two output wire numbers may be assigned, one for the instantaneous output from the series 6000-6999 and the other for the delayed output from the series 7000-7999. However, since only delayed outputs are used in this system, wire numbers 7001 and 7002 are assigned to delay output terminals 22 and 25, respectively. At the same time, these wire numbers are entered at the outputs of the timer coils in the ladder diagram of FIG. 2B. The D-jumpers are left out since these timers are E-Timers (delay on energization). If the D-jumper were connected, 9801 wire number would be entered at terminals 3 and 23, 9802 wire number would be entered at terminals 6 and 26, that is, the last two digits may be the same (02) as in the timer relay output wire number.

LATCHING COIL WIRE NUMBERS

The latching coil wire numbers are assigned as shown in FIG. 17. The wire numbers 0015 and 0017 for the inputs to the coils are taken from the ladder diagram in FIG. 2A. The latching output wire number 8002 is assigned from the series 8000-8999, the last digit (2) being preferably the same as the prefix (2) on 2CR. At the same time, this wire number 8002 is entered at the latching coil output in the ladder diagram for future reference.

PREASSIGNED CONTROL, LATCHING AND TIMER COIL WIRE NUMBERS

There are a number of connections that must be made between the coil boards and the master control board. These have preassigned numbers. Demand pulse A, B and C wire numbers 9001, 9002 and 9003 have been preassigned to terminal 19 in FIGS. 16, 17 and 18, respectively, whereby connections will be made from these coil boards to the master control board in FIG. 13. Wire number 9000 has been preassigned to terminal 20 in FIGS. 16, 17 and 18 whereby the operate pulse connections will be made from the master control board to the three coil boards. Wire number 9005 has been preassigned to terminal 37 in FIG. 17 whereby the restore signal connection will be made from the master control board to the latching coil board. And wire number 9006 has been preassigned to terminals 39, 36 and 39 in FIGS. 16, 17 and 18, respectively, whereby the undervoltage signal connections will be made to the three coil boards from the master control board.

RELAY CONTACTS WIRE NUMBERS

The N.O. and N.C. contacts wire numbers are assigned as shown in FIGS. 14 and 15, respectively.

In FIG. 14, the wire numbers 0001, 0001, 0001, 0006, 0006, 0006, 0006, 0016 and 0014 for the inputs to the N.O. contacts and the wire numbers 0003, 0005, 0006, 0013, 0007, 0021, 0020, 0017 and 0015 for the outputs from the N.O. contacts are taken from the ladder diagram in FIGS. 2A-B. The previously entered line numbers in FIG. 14 facilitate finding these wire numbers in FIGS. 2A–B.

The wire number for the control of the contact is the wire number of the controlling coil output. First, coil output wire numbers 5001, 5001, 8002, 5003, 5004, 7001 and 7002 are entered in the Wire No. column in FIG. 14, each wire number opposite the designation of the associated device 1CR, 2CR, etc., these coil output wire numbers being taken from the connection charts in FIGS. 16, 17 and 18. These same coil output wire numbers are then entered opposite terminals 17–20 and 37–40 at the bottom in the order indicated in the two right-hand columns entitled Wire No. and Terminal. At the same time, these contact control wire numbers are entered at the top control connections of the relay contacts in the ladder diagram of FIGS. 2A–B.

In FIG. 15, a similar wire number assignment procedure is carried out with respect to the N.C. relay contacts as just described with reference to the N.O. contacts.

SWITCH CONTACTS WIRE NUMBERS

The switch contacts wire numbers are assigned as shown in FIG. 19

Both the input logic wire numbers and the output logic wire numbers are taken from the ladder diagram in FIG. 2A and entered on the left and right sides of the switch contacts. Thus, wire numbers 0001, 0003, 0006 and 0006 are entered on the left or input side and wire numbers 0003, 0004, 0018 and 0019 are entered on the right or output side of the switch contacts symbols.

OUTPUT DRIVER WIRE NUMBERS

The wire numbers for the output drivers are assigned as shown in FIGS. 20 and 21.

The logic wire numbers for the left-hand inputs to the drivers are taken from the ladder diagram and entered in the connection charts in FIGS. 20 and 21. Thus, wire number 0005 for driver 10D that is used for the 24 volt D.C. lamp load is entered in FIG. 20. Wire numbers 008 and 0011 for drivers 20D1 and 20D2 that are used for the 115 volt A.C. reversing contactor loads are entered on the separate driver board connection chart in FIG. 21. The line numbers previously entered in FIGS. 20 and 21 facilitate finding the input wire numbers on the ladder diagram.

STEP 3

This step of the method of making an LSL control system involves assigning the boards to the slots in the logic bucket.

The slots are numbered from 1 through 26 in a bucket and successive buckets are labeled A, B, C, etc., if more than one bucket is required. Only one bucket is required for this system since it has only nine PC boards as shown in FIGS. 27A–E including master control board MC, switch contacts board SC, normally-open contact board NO, normally-closed contact board NC, control coil board CC, latching coil board LC, timer coil board TC and output driver boards 10D and 20D.

These nine PC boards may be assigned to any of the slots 1–26 in bucket A. Although the PC boards having cables are preferably assigned to slots nearest the bucket frame hinge to simplify wiring, for illustrative purposes, they have been assigned in sequence from left to right into slots A1–A9 as shown in FIGS. 27A–E.

This assignment is done by entering the bucket designation A and the slot number 1–9 at the top of the connection charts in FIGS. 13–21.

STEP 4

This step of the method of making an LSL control system involves making the wiring lists shown in FIGS. 22–26. While a separate list is shown for each number series, it will be apparent that those numbers that are used in each list could be included in numerical sequence in a single connection list.

Referring to FIG. 22, it will be seen that the form for the connection list includes a Wire No. column at the left-hand side having numbers 00–24 down this column and a plurality of spaces to the right thereof for entry of terminal numbers. The user may enter the first two digits in the Wire No. column and will thereafter enter the terminal numbers in the horizontal row opposite each wire number.

For example, in FIG. 22, the first two digits 00 have been entered in the left column, and similarly the first two digits 50, 70, 80 and 90 have been entered in FIGS. 23–26, respectively. The first two digits may be entered for all the wire numbers on the list or only for those numbers that are used on the connection charts.

The distribution starts with bucket A, slot 1, that is, with the connection chart marked bucket A, slot 1 in FIG. 13. The procedure is to go down the left-hand Wire No. column and then down the right-hand Wire No. column. The first wire number is 9001. The terminal adjacent thereto is 12; therefore, the terminal number A1–12 (meaning bucket A, slot 1, terminal 12) is entered in the horizontal row of wire number 9001 in the connection list of FIG. 26. In the same manner, the next terminal number A1–13 in FIG. 13 is entered in FIG. 26 opposite wire number 9002. This process continues until at the bottom of the right-hand column, terminal number A1–40, being adjacent wire number 0001, is now entered into FIG. 22 opposite wire number 0001.

This process then continues with the entering of all the terminal numbers from the remaining connection charts in FIGS. 14–21 onto the wiring lists in FIGS. 22–26.

STEP 5

The actual wiring can now be carried out. The connection lists in FIGS. 22–26 are the basis for wiring the PC boards in slots 1–9 of bucket A.

The preferred procedure is to start with the connection list in FIG. 22 and to wire the terminals together at the rear of the logic bucket as indicated on this connection list. That is, an electrical conductor is connected from terminal 40 in slot A1 to terminal 1 of slot A2, to terminal 1 of slot A3, to terminal 2 of slot A3 and to terminal 3 of slot A3. Similarly, the terminals in each horizontal row in FIG. 22 are connected electrically by wires. Then a similar connection procedure is carried out with respect to the connection lists in FIGS. 23–26.

The result of this wiring is shown in FIGS. 27A–E wherein the LSL control system is shown. In this control system diagram, so much of each PC board A1–A9 is shown as is in use in the system. The input terminals are shown at the left side and the output terminals are shown at the right side of the PC boards. The control signal terminals are generally shown at the lower portion of these PC boards. The lines between the PC board terminals indicate the wiring connections hereinbefore described.

This completes the logic portion of the LSL control system and only the inputs and outputs are left to be added as hereinafter described.

PANEL BOARD AND POWER WIRE NUMBER ASSIGNMENTS

As shown in FIGS. 27A-B, switch contacts PC board A2 is connected from its cable receptacle SCC by a cable CA1 to cable receptacle IPC in input panel board TBA2.

This input panel board is provided to afford connection of the input signal devices in the field. That is, the input signal devices including the start and stop switches and limit switches LS1 and LS2 are connected to screw terminals A2-1, A2—2, A2-3 and A2-4 of input panel board TBA2. These screw terminals are connected to the respective cable terminals in receptacles IPC.

As instructions for this wiring, these terminal numbers are entered in the Wire No. column at the right-hand portion of the LSL switch board connection chart in FIG. 19. Also, the input panel board designation A2 is entered in FIG. 19 in the T.B. column and 24 is placed at the top to indicate the power voltage of the input signal devices.

To complete the input power wiring, a 24 volt D.C. source is connected to the input switch devices.

The output devices in FIG. 27E are connected to output driver boards A8 and A9. Output panel boards TBA8 and TBA9 are provided to afford connection of the output load devices in the field. That is, of the output load devices, lamp 1PL is connected from a 24 volt D.C. source to screw terminal A8-1 of output panel board TBA8. This panel board has a direct electrical connection from its screw terminal A8-1 to cable receptacle 24-OPC. While only one screw terminal is shown in FIG. 27E, this panel board is like input panel board TBA2 and has 12 screw terminals connected respectively to the 12 connectors in the cable receptacle. A cable CA2 extends from the cable receptacle of output panel board TBA8 to cable receptacle A8C on output driver board A8. As instructions for this wiring, this terminal number A8-1 is entered in the Wire No. column at the right-hand portion of the LSL driver board connection chart in FIG. 20.

The other two output load devices, motor reversing control contactors 1F and 1R, are connected to a 115V A.C. source, and are connected in series therewith across screw terminal pairs 1A-1B and 2A-2B on output panel board TBA9, there being an interlock contact 1R1 of the reverse contactor in series with the coil of forward contactor 1F and an interlock contact 1F1 of the forward contactor in series with the coil of reverse contactor 1R. Second contacts 1F2 and 1R2 are connected in parallel for reversing control of the A.C. motor control across the 115V A.C. source.

The 115 volt output panel board is a voltage step-up or amplifier board that steps the voltage from 24V D.C. to 115V A.C. required for the load devices. For this purpose, this output panel board has 12 reed relays, two reed relays 1PR and 2PR being shown to illustrate the invention. The coils of these reed relays are connected from a 24V D.C. source to the respective connectors of its cable receptacle 115-OPC whereas the normally-open contacts 1PR1 and 2PR1 of these reed relays are connected between screw terminal pairs 1A-1B and 2A-2B. A cable CA3 connects the cable receptacle on this output panel board to the cable receptacle A9C on output driver board A9. While reed relays are shown, other power converters such as Triacs or the like may be used. As instructions for this wiring, these terminal numbers A9-2A, A9-2B and A9-1A, A9-2A are entered in the Wire No. columns at the right-hand portion of the LSL driver board connection chart in FIG. 21.

While the apparatus and method hereinbefore described are effectively adapted to fulfill the objects stated, it is to be understood that the invention is not intended to be confined to the particular preferred embodiment of ladder static logic control system and method of making disclosed, inasmuch as they are susceptible of various modifications without departing from the scope of the appended claims.

I claim:

1. In a static logic control system, a logic system that is the static logic functional equivalent of a relay comprising:

a coil equivalent static logic circuit having a signal input terminal and a single electrical signal, output terminal;

means in said circuit operable upon application to said signal input terminal of an input logic signal simulating a coil energizing signal for causing said coil equivalent static logic circuit to provide at said single, electrical signal, output terminal a time delayed electrical output logic signal simulating the operating time of a relay for contact equivalent static logic circuit operation;

a contact equivalent static logic circuit having a signal input terminal, a signal output terminal and a control input terminal;

and means responsive to application of said coil equivalent static logic circuit electrical output logic signal to said control input terminal for conditioning said contact equivalent static logic circuit to control logic signal transmission between its signal input and signal output terminals;

and said equivalent static logic circuits connectable on a one-to-one basis in a, for example, contact-contact-coil circuit.

2. The invention defined in claim 1, wherein said contact equivalent static logic circuit comprises:

a normally-open contact equivalent static logic circuit responsive to said coil output logic signal for performing a gating function to allow passage of a logic signal from its signal input terminal to its signal output.

3. The invention defined in claim 1, wherein said contact equivalent static logic circuit comprises:

a normally-closed contact equivalent static logic circuit responsive to said coil output logic signal for performing a blocking function to prevent passage of a logic signal from its signal input terminal to its signal output terminal.

4. In a static logic control system, a logic system that is the static logic functional equivalent of a plurality of electromagnetic relays comprising:

a plurality of coil equivalent static logic circuits, each having a signal input terminal and a single, electrical signal, output terminal;

control means operable upon application to the signal input terminal of each of said coil equivalent static logic circuits of an input logic signal simulating a coil energizing signal for causing the respective coil equivalent static logic circuit to provide at its single, electrical signal, output terminal a time delayed electrical output logic signal simulating the operating time of a relay for contact equivalent static logic circuit operation;

a plurality of contact equivalent static logic circuits, at least one for each coil equivalent static logic circuit, and each having a signal input terminal, a signal output terminal and a control input terminal;

and means responsive to application of said coil equivalent static logic circuit electrical output logic signal to said control input terminal for conditioning the associated contact equivalent static logic circuit to control logic signal transmission between its signal input and signal output terminals.

5. The invention defined in claim 4, wherein said plurality of contact equivalent static logic circuits comprise:

means enabling connection of the signal output terminals of a plurality thereof in parallel similar to connection of relay contacts.

6. The invention defined in claim 4, wherein said plurality of contact equivalent static logic circuits comprise:

means enabling connection of a plurality thereof in series similar to connection of relay contact;

and means enabling connection of the signal input terminals of a plurality thereof in parallel similar to connection of relay contacts.

7. The invention defined in claim 4, wherein said control means comprises:

means common to said plurality of coil equivalent static logic circuits for generating clock pulses as operate pulses;

and means responsive to said operate pulses for causing simultaneous operation of all those coil equivalent static logic circuits having input logic signals present at their signal input terminals to prevent logic races therebetween.

8. The invention defined in claim 7, wherein one of said coil equivalent static logic circuits is a latching coil equivalent static logic circuit comprising:

a set signal input terminal, a latching circuit, and means responsive to a signal at said set signal input terminal for controlling operation of its latching circuit into its latched state under the control of said operate pulses providing a latching coil logic output signal;

a reset signal input, and means responsive to a signal thereat for controlling operation of its latching circuit into its unlatched state under the control of said operate pulses terminating said latching coil logic output signal;

and means operable upon a temporary power-off condition for retaining or reestablishing the previous state of said latching circuit.

9. The invention defined in claim 7, wherein one of said coil equivalent static logic circuits is a timer coil equivalent static logic circuit comprising:

an output terminal for providing output signals;

a time-delay circuit;

means responsive to one of said operate pulses for initiating operation of said time-delay circuit which upon time-out applies a time-delay to said output terminal which constitutes an E-timer;

and means responsive to another one of said operate pulses for resetting said time-delay circuit.

10. The inventon defined in claim 9, wherein said timer coil equivalent static logic circuit comprises:

means for converting said E-timer to a D-timer including terminals that can be jumpered for that purpose 11. In a static logic control system, a circuit that is the static logic functional equivalent of a relay comprising:

a coil equivalent static logic circuit;

a master control static logic circuit;

means in said coil equivalent static logic circuit responsive to an input logic signal simulating a coil energizing signal for providing a pulse demand signal to said master control static logic circuit;

means in said master control static logic circuit responsive to said pulse demand signal for providing a time delayed operate pulse to said coil equivalent static logic circuit, the time delay of said operate pulse simulating the operating time of a relay coil;

and means in said coil equivalent static logic circuit responsive to said operate pulse applied thereto only if an input signal is also present thereat for providing a coil logic output signal.

12. In a static logic control system, a circuit that is the static logic functional equivalent of a plurality of electro-magnetic relays comprising:

a plurality of coil equivalent static logic circuits;

a master control static logic circuit common to said coil equivalent static logic circuits;

means in each of said coil equivalent static logic circuits responsive to an input logic signal simulating a coil energizing signal for providing a pulse demand signal to said master control static logic circuit;

means in said master control static logic circuit responsive to said pulse demand signal for applying a time delayed operate pulse to each of said coil equivalent static logic circuits, the time delay of said operate pulse simulating the operating time of a relay coil;

and means in each of said coil equivalent static logic circuits responsive to the operate pulse applied thereto only if an input signal is also present thereat for providing a coil logic output signal whereby all coil equivalent static logic circuits having input signals operate simultaneously to provide their respective coil logic output signals and thereby prevent logic races therebetween.

13. The invention defined in claim 12, wherein said means in each of said coil equivalent static logic circuits responsive to the operate pulse comprises:

means responsive jointly to the trailing edge of said operate pulse and to said input signal for providing said coil logic output signal.

14. The invention defined in claim 12, wherein said static logic control system also comprises:

a normally-open contact equivalent static logic circuit associated with one of said coil equivalent static logic circuits and having an input terminal and an output terminal;

and means therein normally blocking passage of a logic signal from said input terminal to said output terminal;

and said blocking means being responsive jointly to a coil logic output signal from said one coil equivalent static logic circuit and to an input signal at said input terminal for allowing passage of the latter to said output terminal.

15. The invention defined in claim 12, wherein said static logic control system also comprises:

a normally-closed contact equivalent static logic circuit associated with one of said coil equivalent static logic circuits and having an input terminal and an output terminal;

and gating means therein normally allowing passage of a logic signal from said input terminal to said output terminal;

and said gating means being responsive to a coil logic output signal from said one coil equivalent static logic circuit for blocking passage of said logic signal from said input terminal to said output terminal.

16. The invention defined in claim 12, wherein one of said coil equivalent static logic circuits is a latching coil equivalent static logic circuit comprising:

a set input terminal for controlling operation of said circuit into its latched condition providing a latching coil logic output signal;

a reset input terminal for controlling operation of said circuit into its unlatched condition terminating said latching coil logic output signal;

means for providing said pulse demand signal to said master control static logic circuit whenever an input signal simulating a latching coil operating signal is applied to said set input terminal and said latching coil equivalent static logic circuit is in said unlatched condition or whenever an input signal simulating a latching coil restoring signal is applied to said reset input terminal and said latching coil equivalent static logic circuit is in said latching condition;

and means responsive to said operate pulse and said input signal at said set input terminal for providing a latching coil logic output signal and being responsive to said operate pulse and said input signal at said reset input terminal for terminating said latching coil logic output signal.

17. The invention defined in claim 12, wherein one of said coil equivalent static logic circuits is a timer coil equivalent static logic circuit comprising:

an instantaneous output terminal and a delayed output providing output terminal signals for operating instantaneous and delayed contacts, respectively:

means responsive to said operate pulse for providing immediately a logic signal to said instantaneous output terminal;

and means responsive to said instantaneous logic signal for providing a time delayed logic signal to said delayed output terminal.

18. In a ladder static logic control system that is the functional equivalent, component for component, of a relay control system, the combination comprising:

a plurality of static logic circuit boards having uniformly numbered terminals;

each said board having a plurality of like static logic circuits connected to sets of its terminals;

the different boards having respectively different static logic circuits that are functional equivalents of components of a standard relay ladder diagram including relay coils, relay contacts, and control switches;

one of the boards having a master control static logic circuit including a pulse demand terminal that operates in response to a pulse demand signal from a relay coil static logic circuit for sending a time-delayed operate pulse to all the relay coil static logic circuits to operate at the same time all those relay coil static logic circuits that are receiving an input signal;

each relay coil static logic circuit having a signal input terminal and an electrical signal output terminal and comprising means responsive to an input signal for sending a pulse demand signal to said master control static logic circuit, and means responsive to an operate pulse from said master control static logic circuit for providing an electrical output signal at said electrical signal output terminal;

each static logic circuit on the relay contact logic and control switch logic boards having input signal and output signal terminals and a control signal terminal;

means connecting the relay coil static logic board output terminals to the control signal terminals of the relay contact static logic board according to the contacts to be operated respectively thereby;

means connecting the pulse demand signal terminals of the relay coil static logic boards to the pulse demand terminal of the master control static logic board;

means connecting the operate pulse terminal of the master control static logic board to the operate pulse terminals of the relay coil static logic boards;

means for connecting external control switches to the control signal terminals of said control switch static logic board;

one of said boards having a plurality of static logic driver circuits mounted thereon for raising logic output signals to a higher power level for operation of a load device;

means connecting the system output signal terminals of said boards to the input terminals of said driver board;

means connecting the input and output terminals of said control switch static logic board and said relay contact static logic board and the input terminals of said relay coil static logic board in accordance with said standard relay ladder diagram;

and means connecting load devices to output terminals of said static logic driver board.

19. The system defined in claim 18, wherein said relay coil static logic circuit boards comprise:

a latching coil static logic circuit board having a plurality of static logic circuits that are the functional equivalents of latching relay coils.

20. The system defined in claim 18, wherein said relay coil static logic circuit boards comprise:

a timer coil static logic circuit board having a plurality of static logic circuits that are the functional equivalents of timer relay coils.

21. A method of simulating relay logic systems using solid-state logic circuits having unidirectional signal flow-through characteristics wherein the circuits directly replace and simulate, on a one to one basis, relay coils and contacts, comprising the steps of:

generating a delayed signal simulative of the energization of a relay coil in response to a first signal applied to a delay circuit;

b. generating second and third signals;

c. applying said second and third signals to first and second gating circuits respectively in conjunction with said delayed signal;

d. generating complementary output signals from said first and second gating circuits simulative of the operation of relay contacts; and e. applying in cascade, said complementary output signals to additional delay circuits and to additional first and second gating circuits to generate further signals simulative of the operation of relay coils and contacts, respectively.

22. A method of simulating relay logic systems using solid-state logic circuits having unidirectional signal flow-through characteristics wherein the circuits directly replace and simulate, on a one to one basis, relay coils and contacts, comprising the steps of:
 a. generating a delayed signal simulative of the energization of a relay coil in response to a first signal applied to a delay circuit;
 b. generating second and third signals;
 c. applying simultaneously, said delayed signal to first and second logic circuits, said second signal to said first logic circuit and said third signal to said second logic circuit to generate complementary output signals from said first and second logic circuits simulative of the operation of relay contacts;
 d. applying one of said complementary output signals to an electrical load circuit to effect a predetermined action by said load circuit; and
 e. applying, in cascade, another one of said complementary output signals to additional delay circuits and additional first and second logic circuits to generate further output signals simulative of the operation of relay coils and contacts respectively.

23. Solid-state logic circuits having unidirectional signal flow-through characteristics, each responsive to a plurality of applied signals to selectively generate other signals, for simulating relay coils and contacts in solid-state logic systems by the cascading of said logic circuits, the combination comprising:
 a. a plurality of delay circuits, each simulative of a relay coil, and each adapted to generate a delayed output signal in response to a corresponding one of the applied signals;
 b. a plurality of pairs of AND gates, each pair associated with a one of said delay circuits, each AND gate simulative of a relay contact, and each AND gate having first and second input terminals and an output terminal for generating a one of the other signals;
 c. first connecting means connecting the delayed output signal of each of said delay circuits to the first input terminal of an AND gate of an associated pair;
 d. means, including an inverter, connecting the output terminal of each of said delay circuits to the first input terminal of the other AND gate of its associated pair;
 e. second connecting means connecting the output terminal of each of a plurality of pairs of additional ones of said AND gates to the second input terminals of a corresponding one of each of the AND gates of each of said plurality of pairs of AND gates; and
 f. third connecting means connecting the output terminal of each AND gate of said plurality of pairs of AND gates, in cascade, to the first input terminal of other ones of said plurality of pairs of AND gates to develop further simulated relay contacts.

24. Solid-state logic circuits, each responsive to the plurality of applied signals to selectively generate other signals, for simulating relay coils and contacts in solid state logic systems by the cascading of said logic circuits, the combination comprising:
 a. first and second logic circuits, each simulative of the operation of a relay, each of said logic circuits including:
  I. a delay circuit, simulative of a relay coil, adapted to generate a delayed output signal in response to a first one of the applied signals;
  II. a gating circuit, simulative of a relay contact, having first and second input terminals and an output terminal;
  III. first connecting means connecting the delayed output signal of said delay circuit to the first input terminal of said gating circuit;
 b. third connecting means an additional signal to the second input terminal of said gating circuit of said first logic circuit to effect the generation of a one of the other signals at the output terminal of said latter gating circuit in response to the delayed output signal of said delay circuit of said first logic circuit and the additional signal; and
 c. second connecting means connecting the output terminal of said gating circuit of said first logic circuit to the second input terminal of said gating circuit of said second logic circuit to effect the generation of another one of the other signals at the output terminal of said latter gating circuit in response to the delayed output signal of said delay circuit of said second logic circuit and the one of the other signals.

25. Solid-state logic circuits having unidirectional signal flow-through characteristics, each responsive to a plurality of applied signals to selectively generatively generate other signals, for simulating relay coils and contacts in solid-state logic systems by the cascading of said logic circuits, the combination comprising:
 a. first and second logic circuits each simulative of the operation of a relay, each of said logic circuits including:
  I. a delay circuit, simulative of a relay coil, adapted to generate a delayed output signal in response to a one of the applied signals;
  II. first and second gating circuits, simulative of normallly open and normally closed relay contacts respectively, each having first and second inputs terminals and each havng an output terminal for generating a one of the other signals;
  III. first connecting means connecting the delayed output signal of said delay circuit to the first input terminal of said first gating circuit.
  IV. second connecting means, including an inverter, connecting the delayed output signal of said delay circuit to the first input terminal of said second gating circuit;
 b. third connecting means connecting the output terminal of said first gating circuit of said first logic circuit to the second input terminal of a one of said first and second gating circuits second logic circuit;
 c. fourth connecting means connecting the output terminal of said second gating circuit of said first logic circuit to the second input terminal of the other one of said first and second gating circuits of said second logic circuit; and
 d. means individually associated with the second input terminal of each of said first and second gating circuits of said first logic circuit for connecting thereto additional ones of the applied signals.

26. Solid-state logic circuits, each responsive to a plurality of applied signals to selectively generate other signals for simulating relay coils and contacts in solid-state logic systems by the cascading of said logic circuits, the combination comprising:
 a. a first logic circuit, including;

I. a first delay circuit, simulative of a relay coil, responsive to a first one of the applied signals representative of a number of events to be counted, for generating a first delayed output signal after a predetermined number of counted events;

II. a first gating circuit, simulative of a normally close relay contact, having a first input terminal for receiving the first delayed output signal, a second input terminal for receiving a second one of the applied signals, said first gate circuit responsive to the first delayed output signal and the second one of the applied signals to generate a one of the other signals simulative of an open relay contact at an output terminal thereof after the predetermined number of counted events;

b. a second logic circuit, including;

I. a second delay circuit, simulative of a relay coil, respnsive to a third one of the applied signals representative of a detected condition for generating a second delayed output signals at a predetermined time after the application thereto of the third one of the applied signals;

II. a second gating circuit, simulative of a normally open relay contact, having a first input terminal for receiving the second delayed output signal, and a second input terminal for receiving the second one of the applied signal, said second gating circuit responsive to the second delayed output signal and the second one of the applied signals to generate another one of the other signals simulative of a closed relay contact at an output terminal thereof at the predetermined time; and c. connecting means connecting together the output terminals of said first and second gating circuits, whereby the other signals from the output terminals of said first and second gating circuits form a common final signal on said connecting means representative of a predetermined time relationship between the first and second delayed output signals.

27. In a solid-state relay logic system wherein logic circuits, simulative of relay coils and contacts, are interconnected to construct a system of the type for statically monitoring high voltage level and low voltage level input signals and sequentially generating output signals in response to the input signals, the improvement in said logic system comprising:

a. a plurality of converter circuits, each responsive to a one of the high voltage level input signals for generating a corresponding logic level signal;

b. a plurality of logic circuits, each simulative of the operation of a relay, said logic circuits each associated with a one of said plurality of converter circuits, said logic circuits each including;

I. a delay circuit, simulative of a relay coil, responsive to a logic level signal from an associated one of said converter circuits for generating a delayed signal;

II. first and second gating circuits, simulative of normally open and normally closed contacts respectively, each having first and second input terminals and an output terminal for providing a one of the output signals;

III. means connecting the delayed signal from said delay circuit to the first input terminal of said first gating circuit.

IV. means including an inverter, connecting the delayed signal from said delay circuit to the first input terminal of said second gating circuit;

c. means associated with each of the first and second gating circuits for connecting a selected one of the low voltage level input signals to the second input terminals thereof; and d. means for connecting the output terminal of selected ones of said first and second gating circuits of selected ones of said plurality of logic circuits to the delay circuit and to the first and second gating circuits of additional ones of said plurality of logic circuits to form additional simulated relay coils and contacts respectively.

28. The solid-state relay logic system as recited in claim 27 further comprising, a plurality of low voltage level to high voltage level converter circuits, each generating a high voltage level output signal in response to the output signal from a corresponding one of said first and second circuits of said plurality of logic circuits.

29. A logic circuit comprising a plurality of unit circuits which are connected with each other in first and second connection types, each of said unit circuits comprising an AND element having at least two input terminals and an inverter element connected to one input of the AND element, each of said unit circuits being equivalent to one relay contact in operation, said first connection type being a connection type in which the output of the AND element of one unit circuit is connected to the output of the AND element of another unit circuit to form a wired OR connection whereby a circuit construction for carrying out an OR logical operation of unit circuits is formed, said second connection type being a connection type in which the output of the AND element of one unit circuit is connected to the input of the inverter element of another unit circuit, said other input terminal of said AND element of said unit circuits being connected to a signal source, whereby a circuit construction for carrying out an AND logical operation of unit circuits is formed, the all unit circuits being respectively connected with each other in the same sequence as the relay contacts.

30. A logic circuit according to claim 29 which further comprises circuit means for applying a driving signal to the other input of the AND element of the respective unit circuit, said driving signal being equivalent to a driving signal to energize a relay coil for driving the relay contact in operation.

31. A logic circuit according to claim 30 wherein said driving signal applying circuit means includes AND elements for operating responsive to a coincidence between incoming signals through two input terminals, and said driving signal applying circuit means being constructed to switch off each of said unit circuit means by removing the signal from one of said two input terminals at the time of interlocking.

32. A logic circuit according to claim 30 which further comprises time delay means including a separate capacitor connected to said driving signal applying circuit means to impart a time delay to the operation of the logic operation.

33. A logic circuit according to claim 29 which is constructed by using a plurality of circuit boards of one kind, each of the boards being provided with a plurality of said unit circuits and input and output terminals of said unit circuits, said first connection type being obtained by connecting the output terminals with each other on the same boards, and said second connection type being obtained by connecting the output terminals of one board with the input terminals of another board.

34. A logic circuit according to claim 29 further comprising an inerface circuit means connected to an external mechanical switch contact and to one input of the AND element of the unit circuit which is in the first stage among the unit circuits, said interface circuit supplying a signal of the switch contact to the AND element after eliminating chattering of the signal.

* * * * *

UNITED STATES PATENT OFFICE
CERTIFICATE OF CORRECTION

PATENT NO. : 4,038,562
DATED : July 26, 1977
INVENTOR(S) : P. M. Kintner

It is certified that error appears in the above-identified patent and that said Letters Patent are hereby corrected as shown below:

Column 2, line 1, "ladder logic diagram" should read -- ladder static logic diagram --.

line 67, "are used control" should read -- are used as control --.

Column 3, line 2, "operation" should read -- operating --.

line 4, "restraining" should read -- retraining --.

line 68, "LS2" should read -- LS1 --.

Column 4, line 24, "1A-B" should read -- 2A-B --.

line 65, "rely" should read -- relay --.

Column 5, line 2, "3CR" should read -- 3CR1 --.

line 10, "increased" should read -- increase --.

Column 6, lines 20 & 21, "a low nor a high" should read -- a "low" nor a "high" --.

line 35, "closed repeater contact" should read -- closed "repeater" contact --.

Column 7, line 28, "logic" should read -- logics --.

line 28, "two input and an" should read -- two inputs and an --.

line 39, "at either terminal" should read -- at either input terminal.

UNITED STATES PATENT AND TRADEMARK OFFICE
CERTIFICATE OF CORRECTION

PATENT NO. : 4,038,562
DATED : July 26, 1977
INVENTOR(S) : P. M. Kintner

It is certified that error appears in the above-identified patent and that said Letters Patent are hereby corrected as shown below:

Column 10, line 27, "signal terninal CC39" should read -- signal terminal CC39 --.

Column 13, line 10, "AND gates 96 and 98" should read -- AND logic gates 96 and 98 --.

Column 14, line 35, "at a logic 85" should read -- at logic 85 --.

Column 15, lines 39 & 40, "applied to termianl MCC4" should read -- applied to terminal MCC4 --.

line 42, "of logic 102 which" should read -- of logic 120 which --.

Column 20, line 21, "control circuit sends back" should read -- control circuit which sends back --.

Column 23, line 26, "0.03 to 30 seconds" should read -- 0.3 to 30 seconds --.

Column 32, line 50, "its signal output" should read -- its signal output terminal. --.

UNITED STATES PATENT AND TRADEMARK OFFICE
CERTIFICATE OF CORRECTION

PATENT NO. : 4,038,562  
DATED : July 26, 1977  
INVENTOR(S) : P. M. Kintner

It is certified that error appears in the above-identified patent and that said Letters Patent are hereby corrected as shown below:

Column 33, line 48, "signal input, and means" should read -- signal input terminal, and means --.

line 63, "time-delay to said" should be -- time-delay logic signal to said --.

line 67, "The inventon defined" should read -- The invention defined --.

Column 35, line 38, "delayed output providing" should read -- delayed output terminal providing --.

line 39, "output terminal signals" -- should read -- output signals --.

Column 36, line 56, "generating a delayed" should read -- a. generating a delayed --.

Column 38, line 10, "third connecting means an additional" should read -- third connecting means connecting an additional --.

line 41, "and each havng an" should read -- and each having an --.

line 53, "circuits second logic" should read -- circuits of said second logic --.

UNITED STATES PATENT AND TRADEMARK OFFICE
CERTIFICATE OF CORRECTION

PATENT NO. : 4,038,562
DATED : July 26, 1977
INVENTOR(S) : P. M. Kintner

It is certified that error appears in the above-identified patent and that said Letters Patent are hereby corrected as shown below:

Column 39, line 8, "normally close relay" should read -- normally closed relay --.

line 19, "relay coil, respnsive to" should read -- relay coil, responsive to --.

Signed and Sealed this

Tenth Day of June 1980

[SEAL]

Attest:

SIDNEY A. DIAMOND

Attesting Officer

Commissioner of Patents and Trademarks